United States Patent [19]
Kikuchi et al.

[11] Patent Number: 5,321,650
[45] Date of Patent: Jun. 14, 1994

[54] BICMOS SEMICONDUCTOR MEMORY DEVICE USING LOAD TRANSISTORS FORMED ON AN INSULATING FILM

[75] Inventors: Toshiyuki Kikuchi, Ohme; Takahide Ikeda, Tokorosawa, both of Japan

[73] Assignee: Hitachi, Ltd., Tokyo, Japan

[21] Appl. No.: 895,682

[22] Filed: Jun. 9, 1992

[30] Foreign Application Priority Data

Jun. 10, 1991 [JP] Japan .................... 3-137510

[51] Int. Cl.⁵ .......................... H01L 21/225
[52] U.S. Cl. ................ 365/177; 257/370; 257/378; 257/517
[58] Field of Search .............. 365/155, 154, 177; 257/370, 377, 378, 205, 511, 517, 518, 525, 526, 539, 542, 552, 554, 565, 576, 588

[56] References Cited

U.S. PATENT DOCUMENTS

| | | | |
|---|---|---|---|
| 4,879,255 | 11/1989 | Deguchi et al. | 257/370 |
| 4,892,837 | 2/1990 | Kudo | 257/588 |
| 4,984,200 | 1/1991 | Saitoo et al. | 257/370 |
| 5,065,208 | 11/1991 | Shah et al. | 257/517 |

FOREIGN PATENT DOCUMENTS

2-225155 10/1990 Japan .

*Primary Examiner*—Eugene R. LaRoche
*Assistant Examiner*—Vu A. Le
*Attorney, Agent, or Firm*—Antonelli, Terry, Stout & Kraus

[57] ABSTRACT

P-channel MOSFETs in a fully CMOS-type memory cell are formed by a thin film (polysilicon), and portions that serve as source and drain regions of the thin-film p-channel MOSFETs are thickened by a conductor layer having a small resistance value. Further, the thin film and the conductor layer having a small resistance value are formed in common with a base lead-out layer of an npn bipolar transistor constituting a peripheral circuit.

13 Claims, 25 Drawing Sheets

BICMOS SEMICONDUCTOR MEMORY DEVICE USING LOAD TRANSISTORS FORMED ON AN INSULATING FILM

BACKGROUND OF THE INVENTION

The present invention relates to a semiconductor memory device and, particularly, to technology that can be effectively adapted to a static random access memory (hereinafter referred to as SRAM) which is constituted by forming bipolar transistors and complementary MOSFETs (hereinafter referred to as CMOSs) in an integrated form on the same semiconductor substrate.

A Bi-CMOS has been described in, for example, "Nikkei Electronics" published by Nikkei McGrow-Hill Co., Mar. 10, 1986, pp. 199-217. According to the above literature, the memory cell is constituted by a flip-flop type memory cell made of polysilicon having a high resistance load, and peripheral circuits such as the address circuit and the timing circuit are constituted by Bi-CMOS composite switching circuits in order to accomplish an SRAM which operates at high speeds while consuming small amounts of electric power.

According to Japanese Patent Laid-Open No. 202858/1989 (corresponds to U.S. patent application Ser. No. 274,490, filed in the U.S.A. on Nov. 22, 1988, inventors: Meguro et al., assignee: Hitachi, Ltd.), the memory cells in the CMOS-constituted SRAM are constituted by fully CMOS-type memory cells constituted by two CMOS inverters whose inputs and outputs are cross-coupled to each other, though they are not Bi-CMOSs. The above publication further describes an SRAM which includes fully CMOS-type memory cells in a highly integrated form by forming the source-drain regions and channel regions of p-channel MOSFETs of the CMOS inverters using a polysilicon film.

Moreover, U.S. Pat. No. 4,902,640 (Sachitano et al: Date of Patent, Feb. 20, 1990) discloses a Bi-CMOS which includes a vertical npn bipolar transistor having a base drawing layer made of p+-type polysilicon formed to surround a p-type intrinsic base region, an n-type emitter region provided in the intrinsic base region, and an emitter drawing layer made of n+-type polysilicon connected to the n-type emitter region. The above bipolar transistor having independent polysilicon layers as base and emitter drawing layers is also called double-polysilicon self-aligned transistor and features high-speed operation.

SUMMARY OF THE INVENTION

Described below are matters totally discussed by the present inventors in regard to further increasing the speed of operation, increasing the degree of integration, decreasing the consumption of electric power, improving reliability and decreasing the process cost of the SRAM constituted by Bi-CMOSs.

From the standpoint of increasing the speed of operation and increasing the degree of integration, first, it is attempted to fabricate the peripheral circuits of the SRAM by using double-polysilicon self-aligned transistors having independent polysilicon layers as base and emitter drawing layers and to use, as memory cells, the fully CMOS-type memory cells that have p-channel MOSFETs (hereinafter referred to as polysilicon PMOSs) whose source-drain regions and channel regions are made of polysilicon films. The fully CMOS-type memory cells are employed because of the reasons that it is becoming difficult to form high-resistance loads of polysilicon since their sizes are so fine and that it is more advantageous to use fully CMOS-type memory cells which stably hold data than to use flip-flop type memory cells that have high-resistance load from the standpoint of increasing the operation speed of the peripheral circuits.

However, a simple combination of a conventional double-polysilicon self-aligned transistor and a fully CMOS-type memory cell having polysilicon PMOS results in an increase in the number of polysilicon films that must be formed arousing a problem of an increase in the process cost. In order that the process cost will not increase, the present inventors have contrived to use in common the base drawing layer of the double-polysilicon self-aligned transistor and the polysilicon layers that serve as source-drain regions and channel region of the polysilicon PMOS. However, the polysilicon layer of the polysilicon PMOS must have a reduced thickness in order to decrease the leakage current and when it is commonly used as the base drawing layer, there results an increase in the base resistance making it difficult to sufficiently increase the speed of operation of the SRAM constituted by Bi-CMOSs. Not only this, when wiring metals such as aluminum wirings are to be connected to the source-drain regions and the base drawing layer of the polysilicon PMOS, it is considered that a thin polysilicon layer extinguishes due to over-etching at the time of forming contact holes by etching causing electrical reliability to decrease. On the other hand, when the polysilicon layer which is the base drawing layer is thickly formed in order to decrease the base resistance, the polysilicon layer of polysilicon PMOS becomes thick, too, whereby leakage current of the memory cell increases and the consumption of electric power increases.

The present invention was accomplished in order to solve the above-mentioned problems, and one of its objects is to provide technology that is capable of realizing a semiconductor memory device constituted by Bi-CMOSs that features high-speed operation and low power consumption.

Another object of the present invention is to provide technology that is capable of realizing a semiconductor memory device having polysilicon PMOSs and double-polysilicon self-aligned transistors featuring improved electrical reliability and decreased process cost.

A representative example of the present invention will now be briefly described.

That is, the invention is concerned with a semiconductor memory device comprising CMOS memory cells and peripheral circuits including npn-type bipolar transistors which are formed in an integrated form on the same semiconductor substrate, wherein the source-drain region and channel region of p-channel MOSFETs (polysilicon PMOSs) of said CMOS-type memory cell as well as a base drawing layer of said npn bipolar transistors are constituted by a common first polysilicon layer, and an electrically conductive layer having resistance smaller than that of said polysilicon layer is selectively provided on said first polysilicon layer of the source-drain regions of said p-channel MOSFETs and on said first polysilicon layer of said base drawing layer.

The invention is further concerned with a method of producing semiconductor memory devices comprising a step of forming a polysilicon layer on the main surface of a semiconductor substrate; a step of simultaneously forming a first polysilicon pattern that serves as source-drain regions and as a channel region of p-channel MOSFETs (polysilicon PMOSs) of the CMOS-type memory cell and a second polysilicon pattern that serves as a base drawing layer of npn bipolar transistors in the peripheral circuits by patterning said polysilicon layer by etching; and a step of forming an electrically conductive layer having a resistance smaller than that of said polysilicon layer on said first polysilicon pattern that serves as the source-drain regions of said p-channel MOSFETs and on said second polysilicon pattern that serves as said base drawing layer.

According to the above-mentioned means, the polysilicon layer that serves as the source-drain regions of p-channel MOSFETs of said CMOS-type memory cell and as the base drawing layer of npn bipolar transistors in said peripheral circuits, is formed selectively and thickly using an electrically conductive layer having a small resistance. Therefore, the npn bipolar transistors exhibit a small base resistance enabling the peripheral circuits to operate at high speeds. Moreover, the polysilicon layer that serves as the source-drain regions and as the channel region of p-channel MOSFETs of the memory cell is formed as thinly as possible, making it possible to minimize the leakage current of the memory cell. It is therefore made possible to increase the speed of operation and to decrease the consumption of electric power of the semiconductor memory device which comprises CMOS-type memory cells and peripheral circuits including npn-type bipolar transistors that are formed in an integrated form on the same semiconductor substrate.

Moreover, the source-drain regions and channel region of p-channel MOSFETs of the CMOS-type memory cell and the base drawing layer of npn bipolar transistors in the peripheral circuits are formed through the same step, enabling the number of steps for producing semiconductor memory devices to be decreased and the process cost to be decreased, too. In the p-channel MOSFETs, furthermore, the source-drain regions only are formed selectively and thickly using the electrically conductive layer having a small resistance. Therefore, a large margin is obtained for the over-etching at the time of forming contact holes for wirings. This makes it possible to improve electrical reliability of the semiconductor memory devices.

DESCRIPTION OF THE PREFERRED EMBODIMENTS

Figure 1:
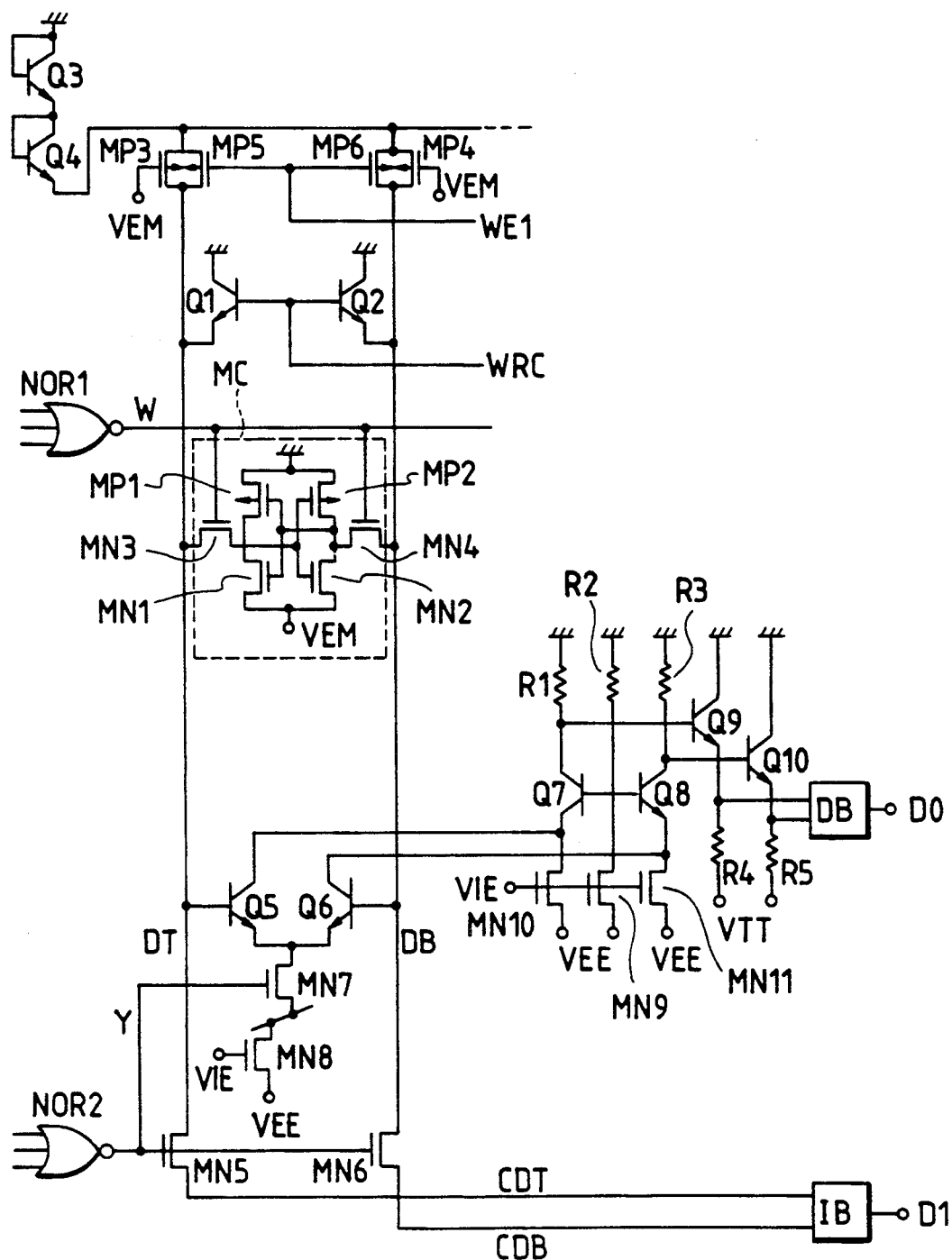
FIG. 1 is a circuit diagram illustrating major portions of an SRAM constituted by Bi-CMOSs to which the present invention is adapted.

Embodiments of the present invention will now be concretely described with reference to the drawings. In all of the drawings explaining the embodiments, those having the same functions are denoted by the same reference numerals but are not described repetitively.

FIG. 1 illustrates an SRAM constituted by Bi-CMOSs to which the present invention is adapted. In the drawings, hereinafter, a bipolar transistor is denoted by symbol Q, an n-channel MOSFET is denoted by MN, and a p-channel MOSFET is denoted by MP. FIG. 1 is a circuit diagram illustrating a memory array portion and a peripheral circuit portion thereof. FIG. 1 exemplifies a word line W, a word line selection circuit NOR1, a memory cell MC, a pair of complementary data lines DT, DB, a load circuit thereof, a write recovery circuit, a sense amplifier, and a column switching circuit. There are further diagramed an output circuit OB corresponding to the sense amplifier and a data input circuit IB.

The memory cell MC is constituted by a CMOS latch circuit having two CMOS inverter circuits constituted by p-channel MOSFETs MP1, MP2 and n-channel MOSFETs N1, N2 of which the inputs and outputs are cross-connected, and by MOSFETs MN3 and MN4 for selecting address provided between the input/output nodes thereof and the complementary data lines DT, DB. The operation voltage of the memory cell of the high-level side is set to be ground potential (e.g., 0 V) of the circuit and the operation voltage of the low-level side is set to be a constant voltage VEM (e.g., −3.3 V) formed by, for example, a voltage generating circuit which is not shown. As described above, memory cells of the SRAM are constituted by the fully CMOS-type memory cells which are arranged in the form of a matrix to constitute a memory array. The gates of transmission MOSFETs MN3 and MN4 of the memory cell MC are connected to the corresponding word line W which is driven by a word line selection circuit NOR1 constituted by, for example, a level converter circuit having a logic function. The complementary data lines DT, DB are provided with data line load means comprising p-channel MOSFETs MP3 and MP4 which have relatively small conductances by taking writing characteristics into consideration and which are always served with a constant voltage VEM through the gates thereof. Source-drain paths of p-channel MOSFETs MP5 and MP6 having a relatively large conductance are provided in parallel with source-drain paths of these MOSFETs MP3 and MP4. A write control signal WE1 is fed to the gates of the MOSFETs MP5 and MP6 so that they are turned on except under the write operation condition. In other words, the MOSFETs MP5 and MP6 constitute data line loads together with the MOSFETs MP3 and MP4 during the reading operation. That is, during the reading operation, the signal amplitude of the complementary data lines is limited to realize high-speed reading. During the writing operation, on the other hand, the MOSFETs MP5 and MP6 having relatively large conductance are turned off by the control signal WE1; i.e., the loads for the complementary data lines DT, DB are constituted by the MOSFETs MP3 and MP4 having small conductance in order to increase the signal amplitude of write data transmitted to the complementary data lines in order to perform high-speed writing.

To the above load circuit is applied a bias voltage whose level is shifted by diode-connected bipolar transistors Q3 and Q4. That is, the high level of signal amplitude of the complementary data lines DT, DB is set to a low potential such as $-2$ VBE (voltage across base and emitter). This causes the signal amplitude of the complementary data lines DT, DB to be limited to a small value during the writing operation, and high-speed writing becomes possible. Writing to the memory cell is effected predominantly by the low level that is transmitted to the complementary data line DT or DB, and there arises no problem even when the high level is set to be as low as $-2$ VBE. That is, the gate potential of the memory MOSFET under the condition where the memory cell is turned on is picked up and is changed over to the off condition by the potential of the complementary data lines that is shifted to the low level via transmission gate MOSFETs. As a result, the memory MOSFET under the off conditions turned on to write an inverted data thereof.

The complementary data lines DT, DB are connected to a pair of common complementary data lines CDT, CDB via column switching n-channel MOSFETs MN5, MN6. To the common complementary data lines CDT, CDB are connected an output terminal D1 of a data input buffer IB that transmits write data.

The gates of the column switching MOSFETs MN5, MN6 receives a column selection signal Y formed by a NOR gate circuit NOR2 which is constituted by a level converter circuit having logic function.

The complementary data lines DT, DB are connected to the bases of differential bipolar transistors Q5, Q6 that constitute a sense amplifier. That is, this SRAM is of the column sense type. The common emitter of the differential transistors Q5 and Q6 is connected to a constant-current MOSFET MN8 via a switching MOSFET MN7 that receives a column selection signal Y. A constant voltage VIE is applied to the gate of the constant-current MOSFET MN8 that is served with a power source voltage VEE (e.g., $-4$ V) of the low-level side of the circuit, thereby to form a constant current.

Collectors of the bipolar transistors Q5 and Q6 are connected to a current/voltage converter circuit. That is, collectors of the bipolar transistors Q5 and Q6 are connected to emitters of bipolar transistors Q7 and Q8 that receive through bases thereof a bias voltage formed by a resistor R2 through which will flow a constant current formed by a MOSFET MN9 that receives the constant voltage VIE. To the emitters of these bipolar transistors Q7 and Q8 are connected constant-current MOSFETs MN10 and MN11 that receive the constant voltage VIE, and on the collector side thereof are provided resistors R1 and R3 for current/voltage conversion. High level/low level corresponding to the data stored in a selected memory cell is output to the complementary data lines DT, DB. The differential bipolar transistors Q5 and Q6 constituting the sense amplifier are turned on or off upon receipt of high level/low level. A constant current flows into the resistor R1 or R3 depending upon the turn on or turn off condition of the differential bipolar transistors via the MOSFET MN7 that is turned on by the column selection signal Y. The read signal converted into a voltage signal via the resistors R1 and R3 is input to the output buffer OB via bipolar transistors Q9, Q10 and an emitter follower circuit constituted by emitter resistors R4 and R5 connected to the power source voltage VTT (e.g., $-2$ V). The output buffer OB is constituted by an ECL circuit and produces an output signal Do of the ECL level that varies depending upon the read signal which is converted into the voltage signal.

The bipolar transistors Q1 and Q2 constitute a write recovery circuit, turned on by a recovery signal WRC that is generated after the data is written, and, upon receipt of a write signal, reset at high speeds the complementary data lines DT, DB that have a relatively great difference in the level. The recovery signal WRC is output via an emitter follower output transistor. Therefore, the complementary data lines DT and DB assume a level equal to the bias level $-2$ VBE that corresponds to the bias circuit (transistors Q3, Q4) since the bipolar transistors Q1 and Q2 are Darlington-connected to the output transistor which forms the recovery signal WRC.

The SRAM circuit constituted by Bi-CMOSs shown in FIG. 1 has been described in detail in Japanese Patent Application No. 62646/1991 (filed on Mar. 4, 1991, applicant: Hitachi, Ltd.).

Figure 2:
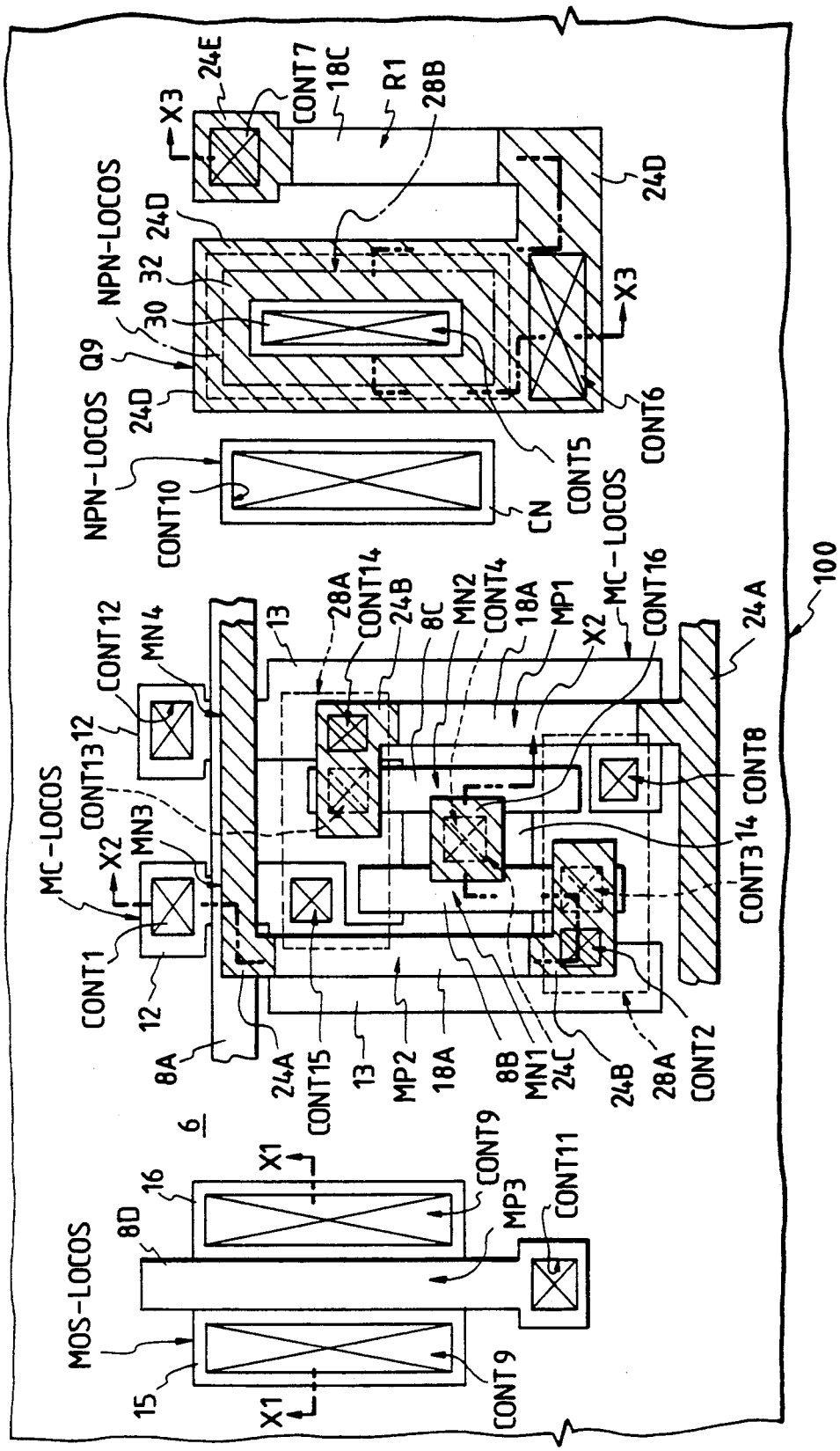
FIG. 2 is a plan view showing the layout of the SRAM constituted by Bi-CMOSs of the present invention.
Figure 3:
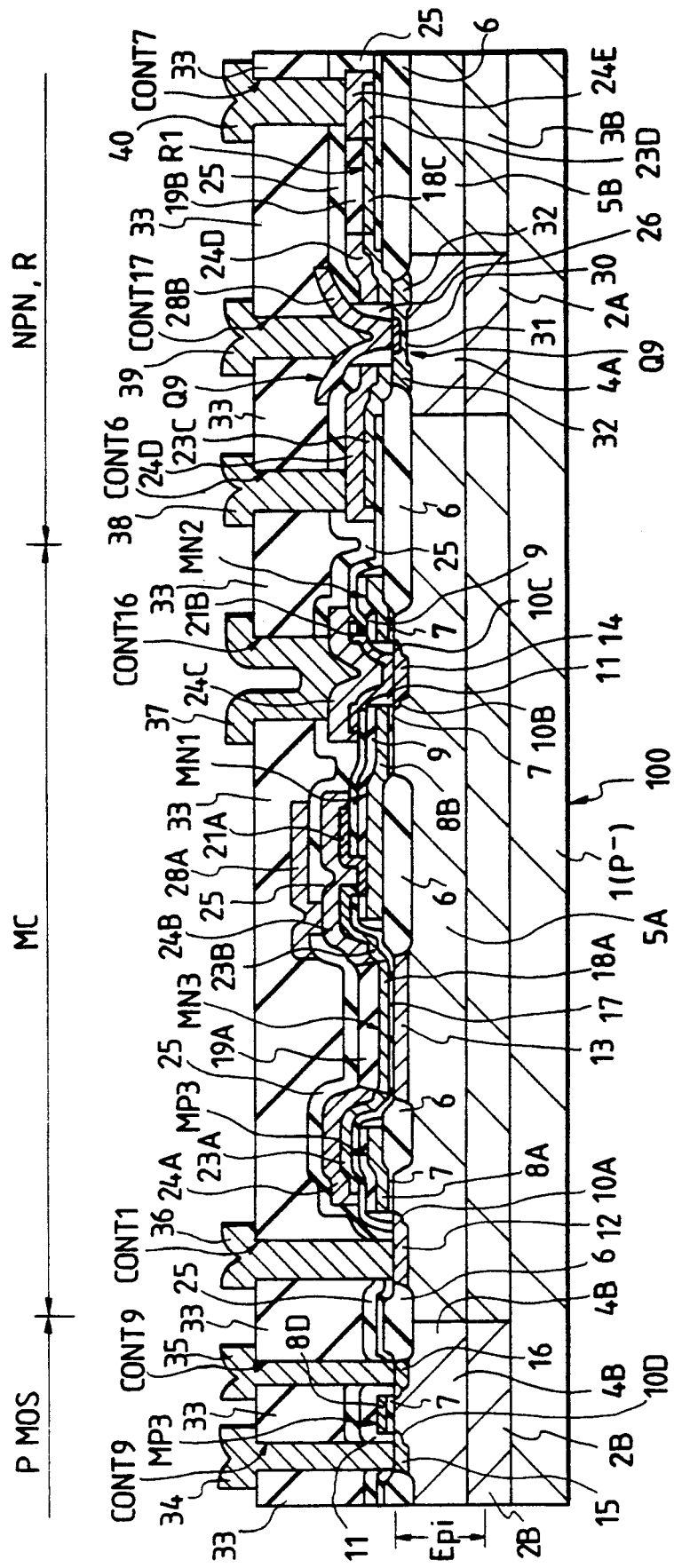
FIG. 3 is a sectional view corresponding to a line X1—X1, a line X2—X2 and a line X3—X3 of FIG. 2.

Next, the structure of SRAM constituted by Bi-CMOSs of the present invention will be concretely described with reference to FIGS. 2 and 3. FIG. 2 is a plan view concretely showing the layout of MOSFETs MP1, MP2, MN1 to MN4 constituting a memory cell MC of the SRAM, as well as a p-channel MOSFET MP3, a bipolar transistor Q9 and a resistance element R1 constituting a peripheral circuit of the SRAM. FIG. 3 is a sectional view of the device cut along lines X1—X1, X2—X2 and X3—X3 of FIG. 2. Described here chiefly are a p-channel MOSFET MP2, n-channel MOSFETs MN1, MN2, MN3 constituting the memory cell, and a p-channel MOSFET MP3, an npn bipolar transistor Q9 and a resistance element R1 constituting the peripheral circuit. Here, it should be recognized that other transistors Q1, Q2, MP1, MP4 and resistance elements R2, R3, etc. shown in FIG. 1 have basically similar structures as those of the transistors and resistance elements shown in FIGS. 2 and 3.

As shown in FIGS. 2 and 3, the SRAM 100 constituted by Bi-CMOSs of the present invention is formed on a p-type single-crystal semiconductor substrate 1. As shown in these drawings, the bipolar transistor Q9, resistance element R1 and p-channel MOSFET MP3 constituting peripheral circuits are formed on the p-type semiconductor substrate 1 of the regions NPN, R and PMOS, and driver MOSFETs MN1, MN2, load p-channel MOSFETs (polysilicon PMOS) MP1, MP2 and transmission MOSFETs MN3, MN4 constituting a CMOS-type memory cell are formed on the p-type semiconductor substrate 1 of the region MC. The bipolar transistor Q9 is a vertical npn bipolar transistor constituted by an emitter region 30 of an n$^+$-type semiconductor region, an intrinsic base region 31 of a p-type semiconductor region, and a collector region 4A of an n-type semiconductor region (N-well). Moreover, the bipolar transistor Q9 has an external (extrinsic) base region 32 of a p$^+$-type semiconductor region that is electrically connected to the intrinsic base region 31. A base drawing (lead-out) layer 23C of a p+-type polysilicon layer is connected to the external base region 32 and, further a conductor layer 24D of tungsten (W) is formed on the base drawing layer 23C in order to decrease the base resistance. The base drawing layer 23C and the conductor layer 24D are provided to surround the emitter region 30, and an emitter drawing (lead-out) layer 28B of an n+-type polysilicon layer is connected to the emitter region 30 via an opening defined by a side wall spacer 26 of an insulating film formed on the side thereof. Thus, the bipolar transistor Q9 has a double-polysilicon self-aligned transistor structure and features high-speed operation. The bipolar transistor Q9 further includes an n+-type buried layer 2A of an n+-type semiconductor region which decreases the series resistance of the collector and a collector pull-up (lead-out) region CN of an n+-type semiconductor region for taking the collector potential out from the surface. A collector electrode (not shown) is connected to the collector pull-up region CN via a connection hole CONT10. Further, a base electrode 38 is connected to the base drawing layer 23C and to the conductor layer 24D via connection holes CONT6 formed in the insulating films 25 and 33. The emitter electrode 39 is connected to the emitter drawing layer 28B via a connection hole CONT5 formed in the insulating film 33. The emitter electrode 39, base electrode 38 and collector electrode are formed by a step of forming a first wiring layer and are composed of, for example, a tungsten (W) layer. Semiconductor regions (impurity-doped layers) constituting the bipolar transistor Q9 are formed on the main surface of the semiconductor substrate 1 or in an n⁻-type single crystalline silicon epitaxial layer Epi grown on the semiconductor substrate 1 by selectively introducing n-type and p-type impurities. Moreover, the bipolar transistor Q9 is surrounded by an isolation region which is formed by a field insulating film 6, p-type semiconductor regions (P-well) 5A, 5B, and p+-type buried layer 3A, 3B of p+-type semiconductor regions, and is electrically isolated from other active elements (such as MOSFETs MN2, MP3, etc.). The plan pattern of field insulating film 6 of the region NPN and of the portion R is depicted by NPN-LOCOS in FIG. 2.

The resistance element R1 is constituted by a p-type polysilicon layer 18C provided on the field insulating film 6. One end of the resistance element R1 is connected to the base drawing layer 23C and the other end thereof is connected to a resistance connection portion 23D of a p+-type polysilicon layer. On the resistance connection portion 23D is provided a conductor layer 24E of tungsten (W), and a wiring 40 is connected to the conductor layer 24E via connection holes CONT7 formed in the insulating films 33 and 25. The p-type polysilicon layer 18C of the resistance element R1 is formed integrally with the base drawing layer 23C and the polysilicon layer of connection portion 23D (formed by the same layer). The conductor layers 24D and 24E are provided in order to prevent the base drawing layer 23C and the connection portion 23D from being over-etched by the step of etching the insulating films 33 and 25 at the time of forming the connection holes CONT6, CONT7 in addition to decreasing the base resistance and the contact resistance. Moreover, the conductor layers 24D and 24E are formed by a method of selectively growing tungsten, and a mask 19B of an insulating film provided on the p-type polysilicon layer 18C is the one that is used for selectively growing the tungsten. The plan patterns of the conductor layers 24D and 24E are indicated by hatched areas in FIG. 2.

The p-channel MOSFET MP3 in the peripheral circuit is provided on the main surface of an n-type semiconductor region (N-well) 4B formed in the n³¹-type epitaxial layer Epi. The p-channel MOSFET PM3 is constituted by a gate electrode 8D of a polysilicon layer containing chiefly n-type impurities, high-concentration source-drain regions 15, 16 of p+-type semiconductor regions, and a gate insulating film 7. The p-channel MOSFET MP3 further includes low-concentration source drain regions 10D of p⁻-type semiconductor regions having an impurity concentration lower than that of the above high-concentration source-drain region, and establishes a so-called LDD (lightly-doped-drain) structure. Moreover, an n+-type buried layer 2B is provided between the n-type semiconductor region 4B and the p⁻-type semiconductor substrate 1 in order to decrease the resistance of the n-type semiconductor region 4B. The upper surface of the gate electrode 8D is coated with the insulating film 9, and a side wall spacer 11 of an insulating film is provided on the side surface of the gate electrode 8D. The side wall spacer 11 is provided to maintain a gap between the side wall of gate electrode and the high-concentration source-drain regions 15, 16. Moreover, source-drain electrodes 34, 35 are connected to the source-drain regions 15, 16 via connection holes CONT9 formed in the insulating films 33, 25 and 17. The source-drain electrodes 34, 35 are formed by the same step as that of forming emitter, base and collector electrodes of the bipolar transistor Q9. Furthermore, a gate wiring that is not shown is connected, via CONT11, to the gate electrode 8D of the p-channel MOSFET MP3. The gate wiring, too, is formed by the same step as that of forming the source-drain electrodes 34 and 35. The plan pattern of field insulating film 6 of the region PMOS is depicted by MOS-LOCOS in FIG. 2.

On the main surface of the p-type semiconductor region (p-well 5A) of the memory cell region MC are formed driver n-channel MOSFETs MN1, MN2, transmission n-channel MOSFETs MN3, MN4 and p-channel MOSFETs (polysilicon PMOS) MP1, MP2 as loads which constitute a CMOS-type memory cell. The driver MOSFET MN1 is constituted by the gate electrode 8B consisting chiefly of the n+-type polysilicon layer, high-concentration source-drain regions 14, 13 consisting of n+-type semiconductor regions, and the gate insulating film 7, and further includes low-concentration source-drain regions 10B of n⁻-type semiconductor regions, and establishes the LDD structure. Similarly, the driver MOSFET MN2 is constituted by the gate electrode 8C of an n+-type polysilicon layer, high-concentration source-drain regions 14, 13 of n+-type semiconductor regions, and the gate insulating film 7, and further includes low-concentration source-drain regions 10C of n⁻-type semiconductor regions, and establishes the LDD structure. The driver MOSFETs MN1 and MN2 have a source region 14 in common, and the drain regions 13 thereof are symmetrically laid out right and left with the source region 14 as a center. A pad electrode 21B for feeding a power source potential VEM (e.g., −3.3 V) is connected to the above common source region 14 via the connection hole CONT4 defined by the side wall spacer 11 of an insulating film provided on the side portions of the gate electrodes 8B and 8C. The pad electrode 21B is composed of an n+- type polysilicon layer and is formed by the same polysilicon layer as the above base drawing layer 23C. On the pad electrode 21B is provided a conductor layer 24C of tungsten (W), and a power source wiring 37 is further formed thereon to supply the power source potential VEM. The conductor layer 24C is formed by the same step as that of forming the conductor layer 24D provided on the base drawing layer 23C for the same purpose, and the power source wiring 37 is formed by the same step as that of forming the emitter and base electrodes 39 and 38.

The transmission MOSFET MN3 is constituted by a gate electrode 8A consisting chiefly of an n+-type polysilicon layer, source-drain regions (source-drain regions are often reversed under the active operation condition) 13, 12 consisting of n+-type semiconductor regions, and the gate insulating film 7, and further includes the low-concentration source-drain regions 10A of n−-type semiconductor region, and establishes the LDD structure. The source region 13 of the transmission MOSFET MN3 and the drain region 13 of the driver MOSFET MN1 are in common, and form one memory node of the memory cell. A wiring layer (complementary data line DT) 36 is connected to the drain region 12 of the transmission MOSFET MN3 via connection holes CONT1 formed in the insulating films 33, 25 and 17. The wiring layer 36 is a tungsten (W) layer formed by the same step as that of forming the emitter and base electrodes 39, 38. Though not diagramed, the wiring layer (data line DT) 36 extends in a direction nearly at right angles with the gate electrode 8A (word line W) of the transmission MOSFET MN3.

Though not shown in FIG. 3, the transmission MOSFET MN4, like the above transmission MOSFET MN3, is constituted by the gate electrode 8A, source-drain region 13, 12 and the gate insulating film 7, and further includes the low-concentration source-drain regions 10A, and establishes the LDD structure. The source region 13 of the transmission MOSFET MN4 and the drain region 13 of the driver MOSFET MN2 are in common, and form another memory node of the memory cell. Moreover, though not diagramed, a wiring layer (complementary data line DB) is connected to the drain region 12 of the transmission MOSFET MN4 through connection holes CONT12 formed in the insulating films 33, 25 and 17. The load p-channel MOSFET (polysilicon PROS) MP2 is constituted by a gate electrode 13 consisting chiefly of an n+-type semiconductor region, source-drain regions 23A, 23B of p+-type polysilicon layers, and the gate insulating film 17. That is, the drain region 13 of the driver MOSFET MN1 and the gate electrode 13 of the MOSFET MP2 are in common. The channel region of the polysilicon PMOS MP2 is constituted by a polysilicon layer 18A which is the layer same as the polysilicon layer constituting the source-drain regions 23A and 23B. The drain region 23B of the polysilicon PMOS MP2 is electrically connected to the gate electrode 8B of the driver MOSFET MN1 by a tungsten (W) conductor layer 24B formed thereon and by an n+-type polysilicon layer 21A made of the same layer as the polysilicon layer 18A. The connection between the n+-type polysilicon layer 21A and the gate electrode 8B is the ohmic connection between the n+-type polysilicon layers, and is denoted by CONT3 in FIG. 3. Moreover, a conductor 24A formed by the same layer as the conductor layer 24B is provided on the source region 23A of the polysilicon PMOS MP2, and, though not diagramed, ground potential (e.g., 0 V) is fed to the conductor layer 24A. The polysilicon layers 18A, 23A and 23B are formed by the same layer as the polysilicon layer of the above base drawing layer 23C. The polysilicon layer 18A of the channel region has a thickness of, for example, as small as about 40 nm, enabling the leakage current of the CMOS-type memory cell MC to be decreased or prevented and, hence, the power consumption of the SRAM to be decreased. Moreover, the source-drain regions 23A, 23B of polysilicon PMOS MP2 are formed by the same thin layer as that of polysilicon layer 8A, and the source-drain resistances may increase or the margin for the over-etching may decrease. According to the present invention, however, the conductor layer 24A, 24B of tungsten are selectively provided on the source-drain regions 23A, 23B only, so that the source-drain resistances will not increase or the margin for the over-etching will not decrease. It is therefore possible to accomplish an SRAM which consumes small amounts of electric power yet having high reliability. The plan patterns of the conductor layers 24A, 24B and 24C are indicated by hatched areas in the memory cell region MC of FIG. 2. A cross-coupling wiring 28A of an n+-type polysilicon layer is connected to the conductor layer 24B via a connection hole CONT3 formed in the insulating film 25. The cross-coupling wiring 28A is further connected via a connection hole CONT8 to the drain region 13 of the driver MOSFET MN2 which is another memory node. Due to the cross-coupling wiring 28A, the drain region 23B of the polysilicon PMOS MP2 and the gate electrode of the driver MOSFET MN1 are connected to each other, and the drain region 13 of the driver MOSFET MN2 and the drain region 23B of the polysilicon PMOS MP2 are connected to each other. The cross-coupling wiring 28A is formed by the same step as that of forming the emitter drawing layer 28B. The plan pattern of the cross-coupling wiring 28A is indicated by a dotted line on the region MC of FIG. 2. Like the aforementioned polysilicon PMOS, MP2, the load p-channel MOSFET (polysilicon PMOS) MP1 is constituted by the gate region 13 consisting chiefly of an n+-type semiconductor region, source-drain regions 23A, 23B consisting of p+-type polysilicon layers, and the gate insulating film 17. That is, the drain region 13 of the driver MOSFET MN2 and the gate electrode 13 of the polysilicon PMOS MP1 are in common. Likewise, the channel region of the polysilicon PMOS MP2 is constituted by the polysilicon layer 18A. The drain region 23B of the polysilicon PMOS MP1 is connected to the gate electrode 8C of the driver MOSFET via a connection hole CONT13, and ground potential (e.g., 0 V) is fed to the source region 23A. Further, the cross-coupling wiring 28A is connected, via a connection hole CONT14, to the conductor layer 24B provided on the drain region 23B of the polysilicon PMOS MP1, and is further connected to the drain region 13 of the driver MOSFET MN1 which is the above-mentioned one memory node via a connection hole CONT15. Here, a pattern of the field insulating film 6 on the memory cell region MC is depicted by MC-LOCOS in FIG. 2.

In the SRAM constituted by Bi-CMOSs of the present invention, what draws attention is that the source-drain regions and channel region of polysilicon PMOSs constituting a memory cell and the base drawing layer of bipolar transistors constituting peripheral circuits are formed by a common polysilicon layer, and the source-drain regions and the base drawing layer have an increased thickness by selectively forming thereon a conductor layer of tungsten (W) having small resistance. This constitution enables the thickness of the channel region of the polysilicon PMOS to be decreased as small as possible and the base resistance of the bipolar transistor to be decreased, making it possible to realize the SRAM constituted by Bi-CMOSs which features high-speed operation as well as low power consumption.

Next, a method of producing the SRAM constituted by Bi-CMOSs shown in FIGS. 2 and 3 will be concretely described with reference to FIGS. 4 to 19 (sectional views showing major portions for each of the production steps) and FIGS. 20 to 24 (pan views showing major portions for each of the production steps).

Figure 4:
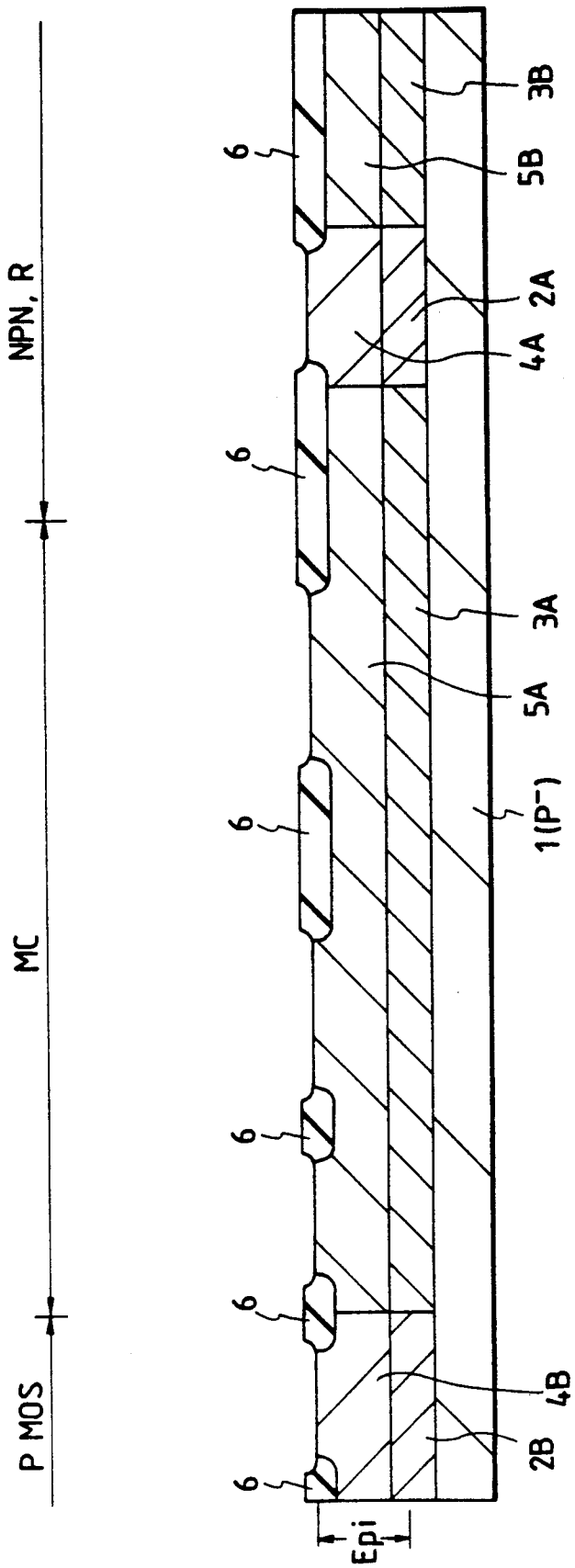
FIGS. 4 to 19 are sectional views illustrating a method of producing the SRAM constituted by Bi-CMOSs shown in FIGS. 2 and 3 in the order of production steps.

Referring, first, to FIG. 4, a p⁻-type semiconductor substrate 1 consisting of single crystalline silicon is prepared. The p⁻-type semiconductor substrate 1 has a resistance of, for example, about 6 to 12 [ohms-cm]. Next, n-type impurities are selectively introduced into the main surfaces of the semiconductor substrate where the bipolar transistor Q9 and the p-channel MOSFET MP3 are to be formed. The n-type impurities comprise, for example, antimony (Sb) of a concentration of about $10^{15}$ [atoms/cm$^2$]. Then, p-type impurities are selectively introduced into the main surfaces of the semiconductor substrate 1 where isolation regions are to be formed in order to electrically isolate the memory cell region MC and the bipolar transistor Q9. The p-type impurities comprise, for example, boron (B) of a concentration of about $10^{13}$ [atoms/cm$^2$]. Then, the n-type and p-type impurities are thermally diffused and spread in the semiconductor substrate 1 in order to form n⁺-type buried layers 2A and 2B consisting of n⁺-type semiconductor regions and p⁺-type buried layers 3A and 3B consisting of p⁺-type semiconductor regions. On the main surface of the semiconductor substrate 1 is then grown an n⁻-type epitaxial layer Epi which consists of single crystalline silicon and has a resistance of, for example, about 3 [ohms-cm] and a thickness of, for example, about 1.2 [μm]. As the n⁻-type epitaxial layer Epi grows, the n-type and p-type impurities forming the n⁺-type buried layers 2A, 2B and the p⁺-type buried layers 3A, 3B rise to the lower portion of the n⁻-type epitaxial layer Epi and are diffused therein. Next, n-type impurities are selectively introduced into the main surface of the n⁻-type epitaxial layer Epi on the regions where the bipolar transistor Q9 and p-channel MOSFET MP3 are to be formed. The n-type impurities comprise, for example, phosphorus (P) of a concentration of about $10^{12}$ [atoms/cm$^2$] and are implanted with the energy of about 120 to 130 [keV]. Then, p-type impurities are selectively introduced into the main surfaces of the n⁻-type epitaxial layer Epi of the regions where memory cell region MC and isolation region are to be formed. The p-type impurities comprise boron fluoride (BF$_2$) or boron (B) of a concentration of about $10^{12}$ atoms/cm$^2$] and are implanted with the energy of about 50 to 70 [keV]. When the monovalent boron (B) is to be used, it is recommended to set the energy of implantation to be about 100 to 140 [keV]. Next, the thermal diffusion is carried out at a high temperature, such that the n-type and p-type impurities introduced into the n⁻-type epitaxial layer Epi are spread and diffused in order to form n-type semiconductor regions (n-well) 4A, 4B and p-type semiconductor regions (p-well) 5A, 5B. The thermal diffusion is carried out in an N$_2$ atmosphere of a temperature of as high as, for example, 1100° to 1300° [° C.]for about 20 to 40 minutes. The n-type semiconductor region (n-well) 4A is used as the collector region (intrinsic collector) of the bipolar transistor Q9. A p-type semiconductor region 5B that serves as the isolation region is so formed as to come into contact with the upper surface of the p⁺-type buried layer 3B, and works to electrically isolate the bipolar transistor Q9 together with the p-type semiconductor region 5A and p⁺-type buried layer 3A from other elements.

Figure 20:
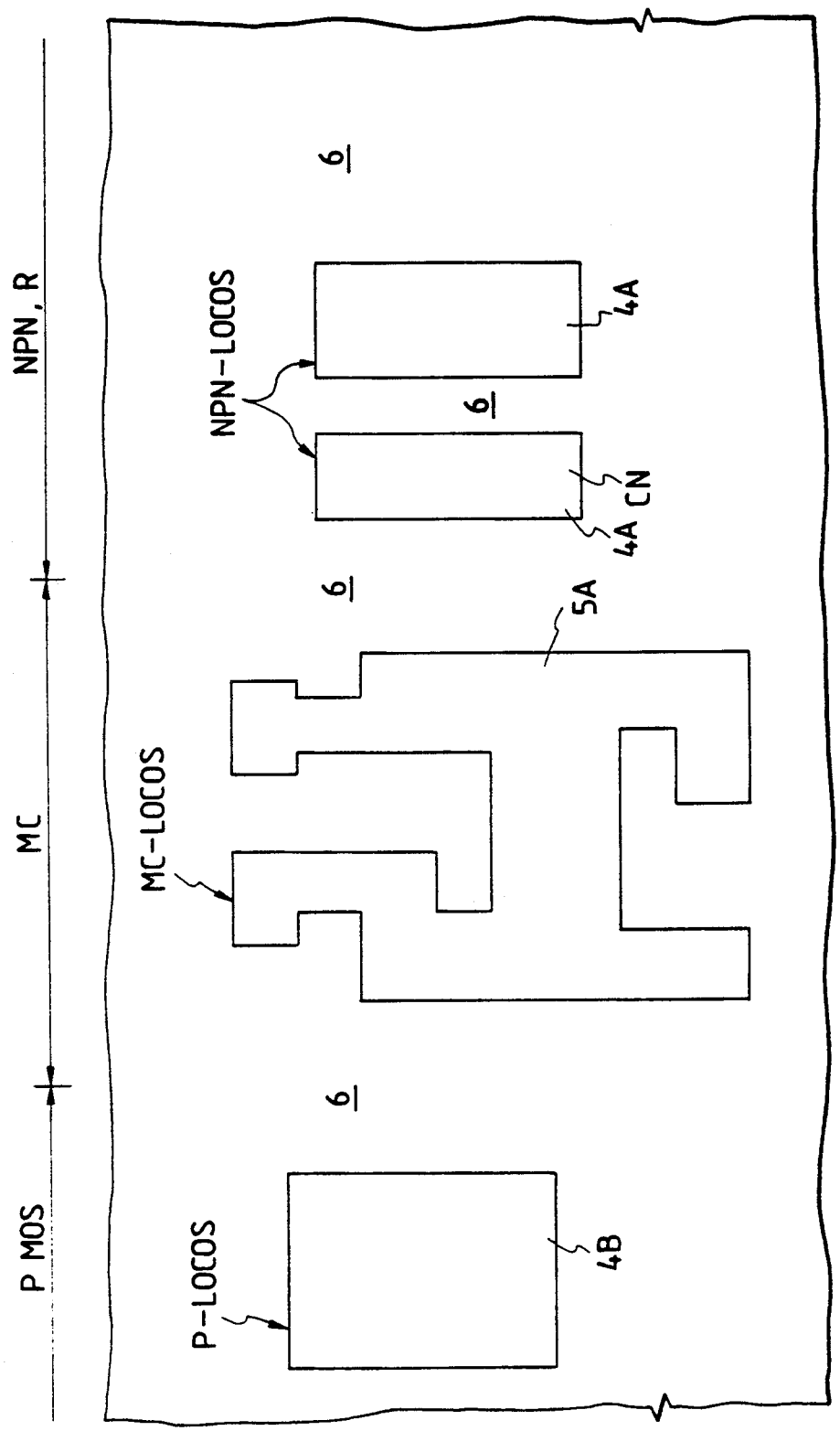
FIG. 20 is a plan view showing the layout of the device that corresponds to FIG. 4.

Next, an antioxidizing mask such as a silicon nitride film is selectively formed on the n⁻-type epitaxial layer Epi of the regions where bipolar transistor Q9, p-channel MOSFET MP3 and memory cell MC will be formed. Then, the main surface of the n⁻-type epitaxial layer Epi exposed through the antioxidizing mask is thermally oxidized in order to selectively form a field insulating film 6 which is composed of a silicon oxide film. The field insulating film is formed by the steam oxidation method at a temperature as high as about 1000 [° C.]maintaining a thickness of about 600 [nm]. The plan pattern of the field insulating film 6 is depicted by P-LOCOS, MC-LOCOS and NPN-LOCOS as shown in FIG. 20 and is so formed as to surround the active regions where the active elements will be formed. After the field insulating film 6 is formed, though not shown in FIG. 4, n-type impurities are selectively introduced at a high concentration into the region where the bipolar transistor Q9 is to be formed in order to form a collector pulling region CN of the bipolar transistor Q9 consisting of an n⁺-type semiconductor region as shown in FIG. 20. The collector pulling region CN is so provided that the bottom surface thereof comes in contact with the n⁺-type buried layer 2A thereby to decrease the collector series resistance together with the n⁺-type buried layer 2A. Thus, the substrate (semiconductor substrate 1 including n⁻-type epitaxial layer Epi etc.) is completed as an underlayer in which will be formed the SRAM constituted by Bi-CMOSs.

Figure 5:
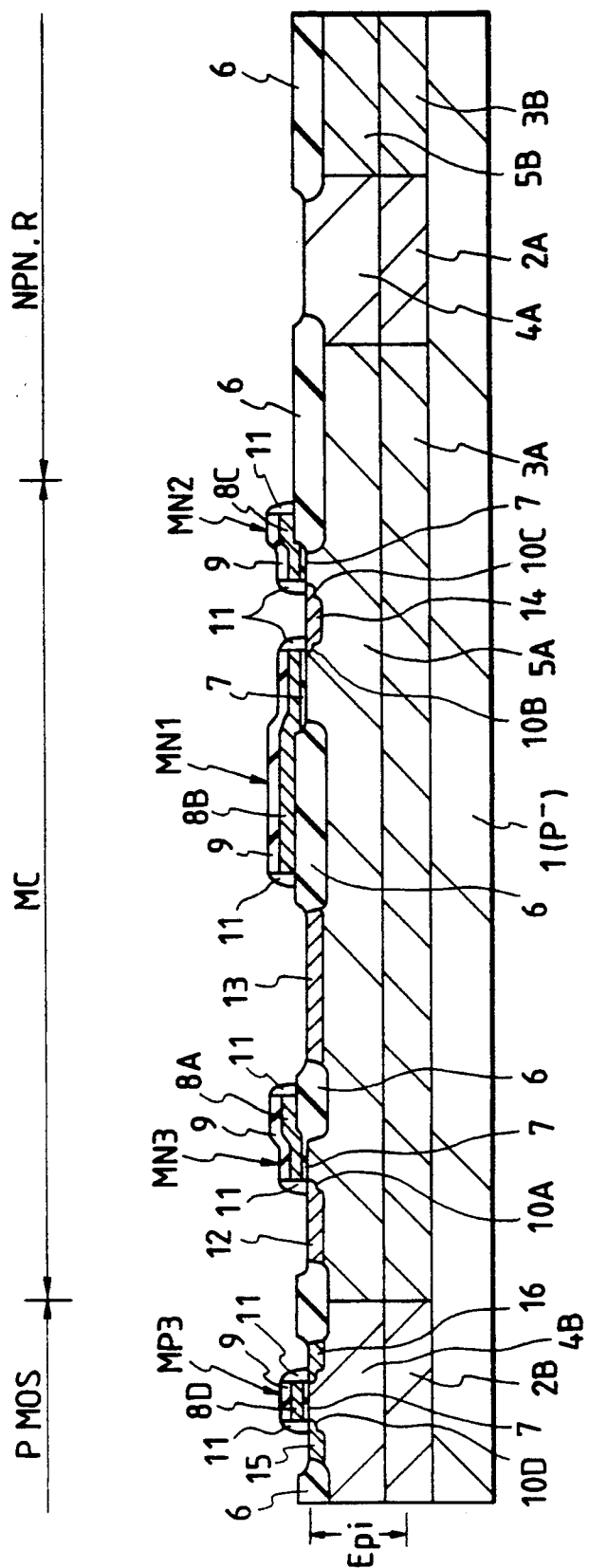
Figure 21:
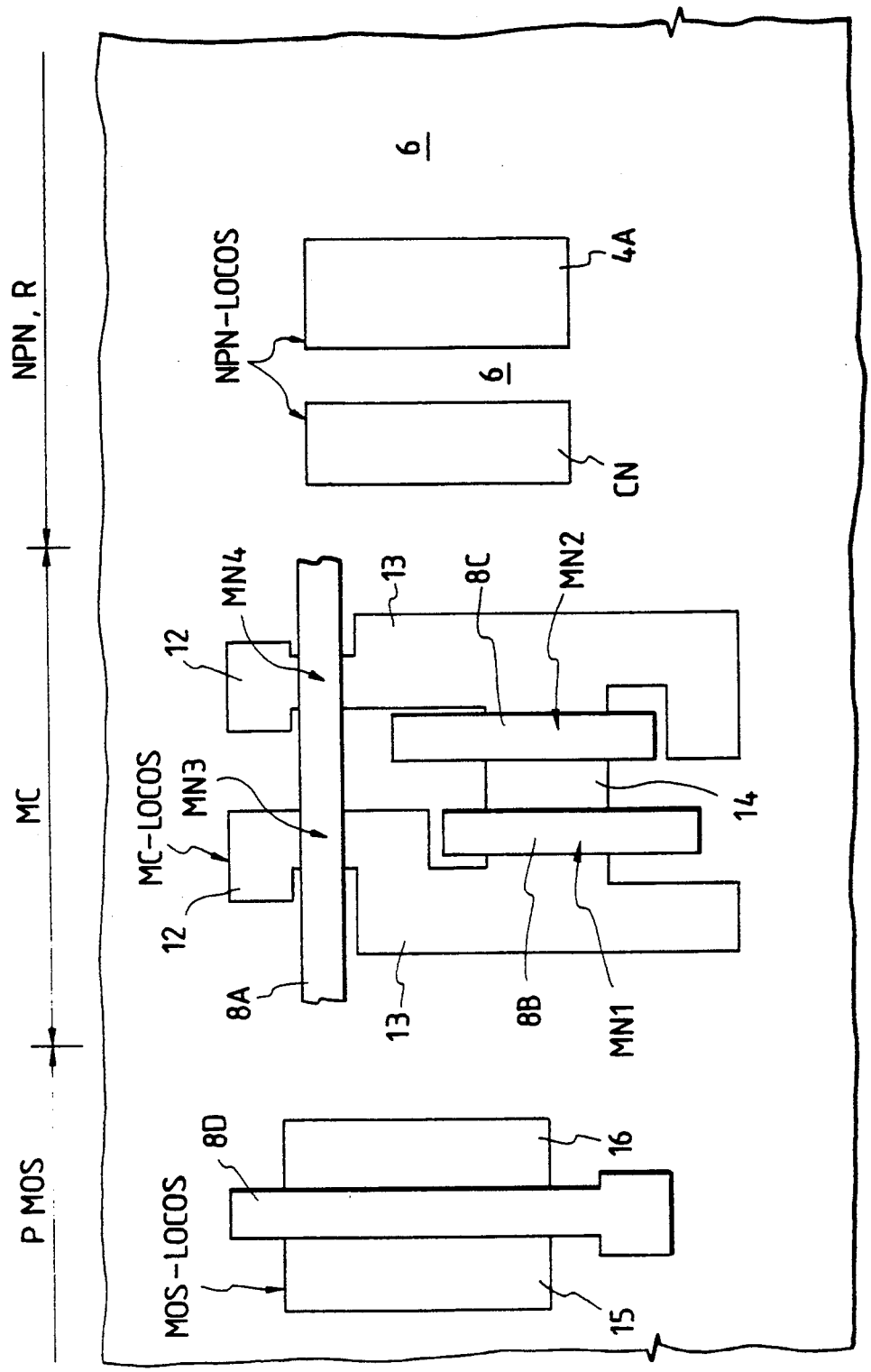
FIG. 21 is a plan view showing the layout of the device that corresponds to FIG. 5.

Next, as shown in FIG. 5, a gate insulating film 7 is formed on the main surfaces of the n-wells 4A, 4B and p-well 5A. The gate insulating film 7 is formed by the steam oxidation method at a temperature as high as about 800° to 900 [° C.]and has a thickness of about 10 to 20 [nm]. Next, a polysilicon film is formed on the whole surface of the substrate inclusive of the gate insulating film 7 and the field insulating film 6. The polysilicon film is deposited by the CVD (chemical vapor deposition) method maintaining a thickness of about 200 to 300 [nm]. N-type impurities (e.g., phosphorus (P)) are introduced into the polysilicon film by the thermal diffusion method or the ion implantation method in order to decrease the resistance. Next, an insulating film 9 is formed on the whole surface of the polysilicon film. The insulating film 9 is composed of a silicon oxide film having a thickness of about 100 to 200 [nm] deposited by the CVD method. Next, the insulating film 9 and the polysilicon film are successively etched into predetermined shapes in order to form driver MOSFETs MN1, MN2, transmission MOSFETs MN3, MN4, as well as gate electrodes 8B, 8C, 8A and 8D of the p-channel MOSFET MP3 of the peripheral circuit. The etching is an anisotropic etching such as RIE (reactive ion etching) effected by using an etching mask (photoresist) formed by the photolithography technology. Plan patterns of the gate electrodes are shown in FIG. 21. Next, n-type impurities are selectively introduced into the main surface of the p-well 5A exposed through the gate electrodes 8A, 8B and 8C. The n-type impurities comprise phosphorus (P) of a concentration of, for example, about $1 \times 10^{13}$ [atoms/cm$^2$] and are implanted with the energy of about 50 [keV]. The n-type impurities are introduced into the gate electrodes 8A, 8B and 8C in a self-aligned manner. The n-type impurities are introduced at a relatively low concentration to form driver MOSFETs MN1, MN2 and transmission MOSFETs MN3, MN4 having the LDD structure. Upon the introduction of the n-type impurities, there are formed source-drain regions 10A, 10B and 10C consisting of n-type semiconductor regions. Then, p-type impurities are selectively introduced into the main surface of the n-well 4B exposed through the gate electrode 8D in order to form source-drain regions 10D of a low concentration of the p-channel MOSFET MP3 simultaneously with the formation of the source-drain regions 10A, 10B and 10C of low concentration. The p-type impurities comprise boron fluoride (BF$_2$) of a concentration of about $1 \times 10^{13}$ [atoms/cm$^2$] and are implanted with the energy of about 40 [keV]. The p-type impurities are introduced into the gate electrode 8D in a self-aligned manner. Then, a side wall spacer 11 is formed on the side portions of the gate electrodes 8A, 8B, 8C and 8D. The side wall spacer 11 is formed by depositing a silicon oxide film on the whole surface of the substrate and by effecting anisotropic etching such as RIE to a degree that corresponds to the thickness of the silicon oxide film that is deposited. The silicon oxide film of side wall spacer 11 is formed by the CVD method using an inorganic silane gas and a nitrogen oxide gas as source gases.

The silicon oxide film is formed maintaining a thickness of about 400 to 500 [nm]. The side wall spacer 11 has a length of about 250 to 300 [nm] in the lengthwise direction of gate (lengthwise direction of channel).

Due to the anisotropic etching, portions of the gate insulating film 7 exposed through the gate electrodes 8A, 8B, 8C and 8D as well as the gate insulating film 7 of the region of forming the bipolar transistor Q9, are over-etched and are removed. In this case, the silicon layer is over-etched to a small degree on the main surface of the n-wells 4A, 4B and p-well 5A serving as underlying layers for the gate insulating film 7 that is removed. After the side wall spacers 11 are formed, the heat treatment is effected in an inert gas (e.g., argon gas) atmosphere at about 800 [° C.]. Due to the heat treatment, the silicon oxide film constituting the side wall spacer 25 becomes dense, whereby the source-drain regions 21A, 21B and 24C of low concentration are activated to recover damage in the silicon layer caused by over-etching.

Next, the regions for forming the bipolar transistor Q9 and the p-channel MOSFET MP3 are covered with a mask of a photoresist film by using photolithography technology. By using the above mask, the n-type impurities are introduced into the main surface of the p-well 5A in a manner being self-aligned with respect to the gate electrodes 8A, 8B and 8C and the side wall spacers 11. The n-type impurities comprise arsenic (As) of a concentration of, for example, $10^{15}$ to $10^{16}$ [atoms/cm$^2$] and are implanted with the energy of about 70 to 90 [keV]. Upon the introduction of the n-type impurities, source-drain regions 12, 13 and 14 of a high concentration of MOSFETs MN1, MN2, MN3 and MN4 are formed on the main surface of the p-well 5A. The above-mentioned mask is then removed.

Next, a mask is formed having an opening for the region where the p-channel MOSFET MP3 will be formed. The mask consists of a photoresist film formed by the photolithography technology. Thereafter, using the above mask, p-type impurities are introduced into the main surface of the n-well 4B. The p-type impurities comprise boron fluoride (BF$_2$) of a concentration of about $10^{15}$ to $10^{16}$ [atoms/cm$^2$] and are implanted with the energy of about 70 to 90 [keV]. Upon the introduction of the p-type impurities, there are formed source-drain regions 15, 16 of a high concentration of the p-channel MOSFET MP3. The mask is then removed.

Next, the n-type impurities and the p-type impurities that are introduced are heat-treated to recover damage caused by the implantation of ions and to activate the impurities. The heat treatment is effected at a temperature of as high as, for example, 900° to 1000 [° C.]for about 10 minutes. Through the step of forming the high-concentration source-drain regions 12, 13, 14, 15 and 16, there are substantially completed the driver MOSFETs MN1, MN2, transmission MOSFETs MN3, MN4, and p-channel MOSFET MP3 that are shown in FIGS. 5 and 21. Though n$^+$-type polysilicon is used in this embodiment as the material of gate electrode for the MOSFETs, it is also allowable to use a gate electrode of the polycide structure which is a silicide by laminating a high-melting metal layer such as of tungsten (W) or molybdenum (MO) on the polysilicon.

Figure 6:
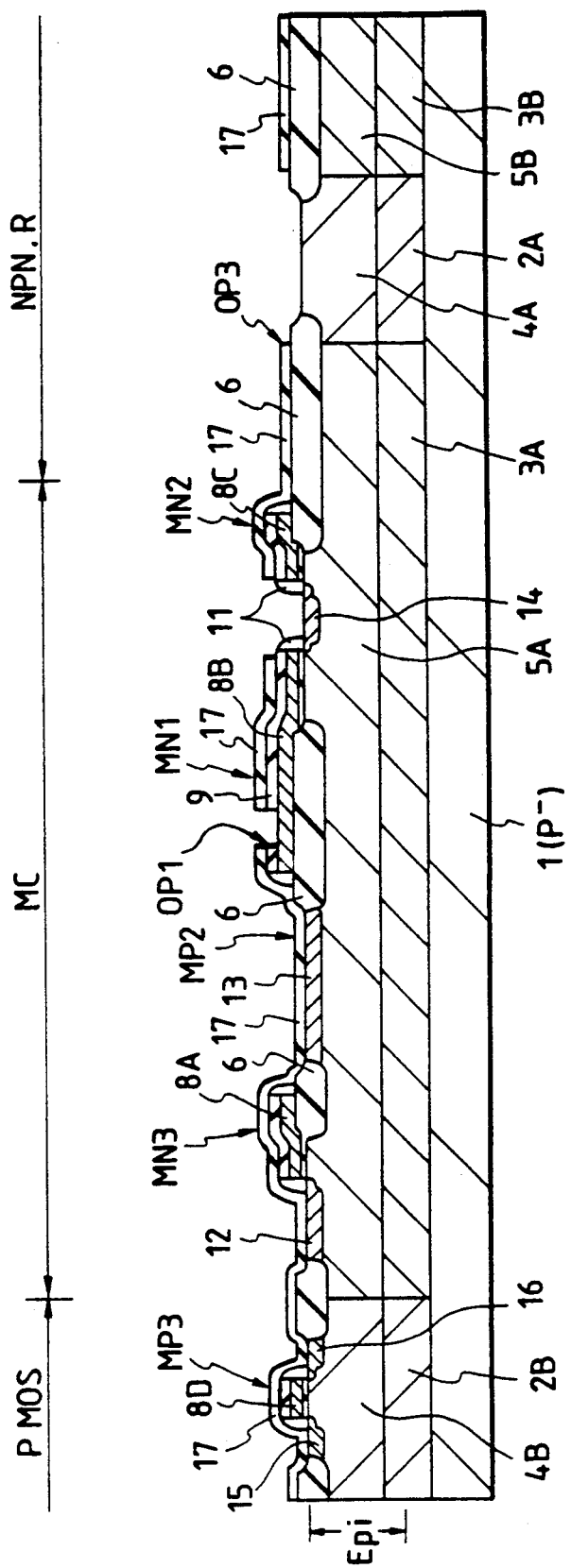

Referring next to FIG. 6, a silicon oxide film 17 having a thickness of about 10 [nm] is formed on the whole surface of the substrate by, for example, the CVD method. The silicon oxide film 17 on the semiconductor region 13 serves as a gate insulating film for the polysilicon PMOS MP2. Next, predetermined portions of the silicon oxide film 17 and the insulating film 9 are selectively removed by etching by the ordinary photolithography technology and etching technology, in order to form openings OP1, OP2 and OP3 on the gate electrode 8B, on the common source region 14 and on the n-type collector region 4A.

Figure 7:
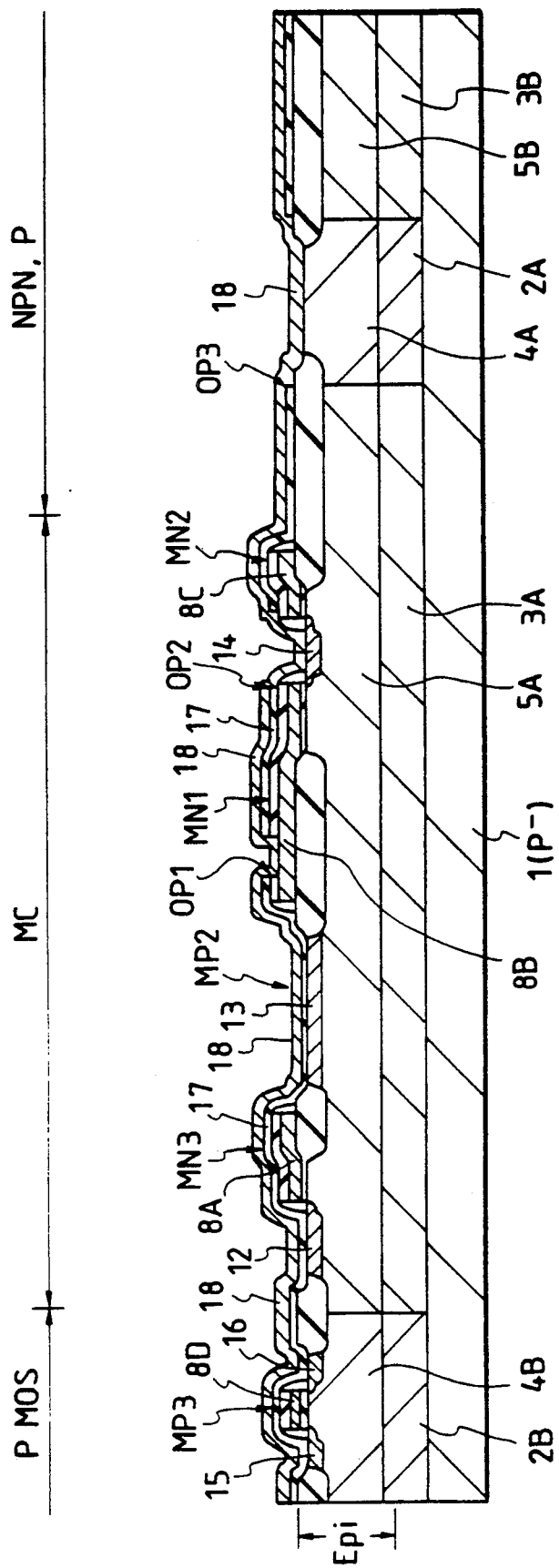

Then, as shown in FIG. 7, a polysilicon layer 18 is deposited on the whole surface of the substrate that includes the openings OP1, OP2 and OP3 by, for example, the CVD method. The polysilicon layer 18 (about 40 nm, thick) is much thinner than the gate electrodes 8A, 8B, 8C and 8D in order to decrease the leakage current of the polysilicon PMOS MP2 and to increase the resistance of the polysilicon resistor R1 per a unit length. Furthermore, the polysilicon layer 18 nay be the silicon layer of either the intrinsic state without containing impurities or the state of being coped with n-type or p-type impurities at a low concentration.

Figure 8:
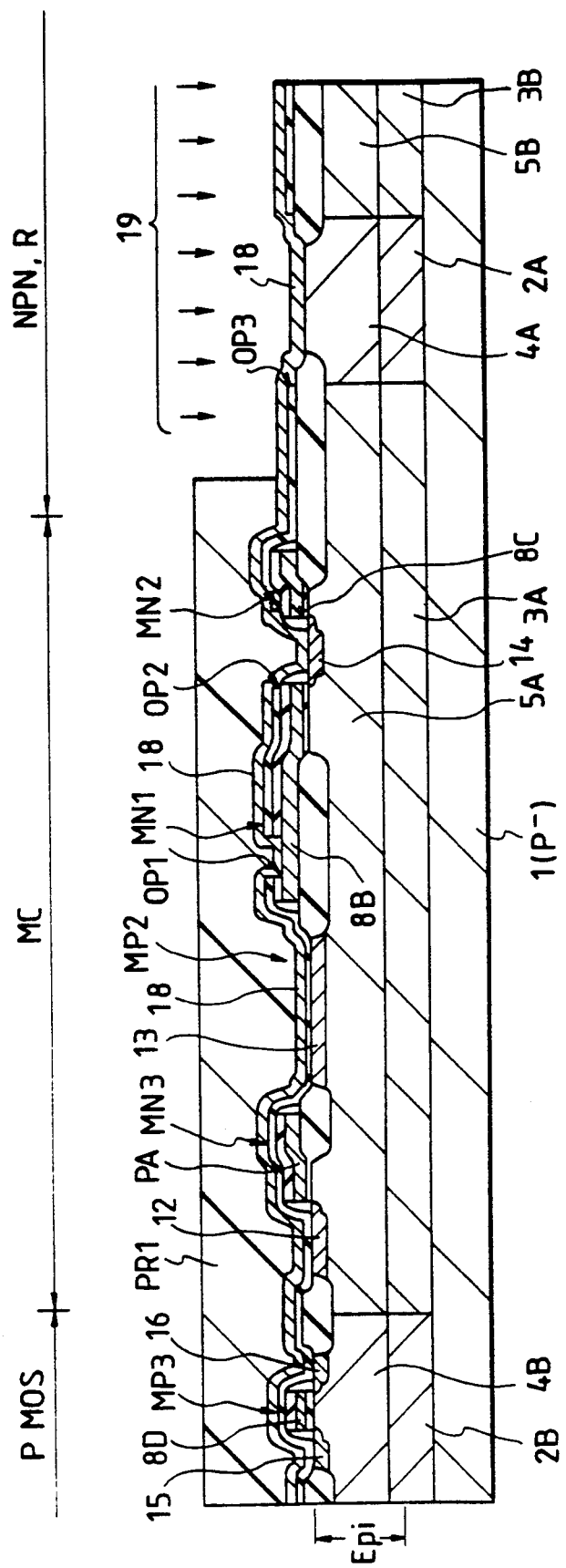

Next, as shown in FIG. 8, a photoresist mask PR1 is formed to cover the regions MC and PMOS, and p-type impurities 19 (e.g., boron) are selectively introduced into the polysilicon layer 18 using the mask PR1 as a mask for introducing impurities. The p-type impurities 19 are introduced by, for example, the ion implantation method in an amount which is arbitrarily adjusted to obtain a desired resistance of the polysilicon resistor R1. Upon the introduction of the p-type impurities 19, there is formed a p-type polysilicon layer 18C. The mask PR1 is then removed.

Figure 9:
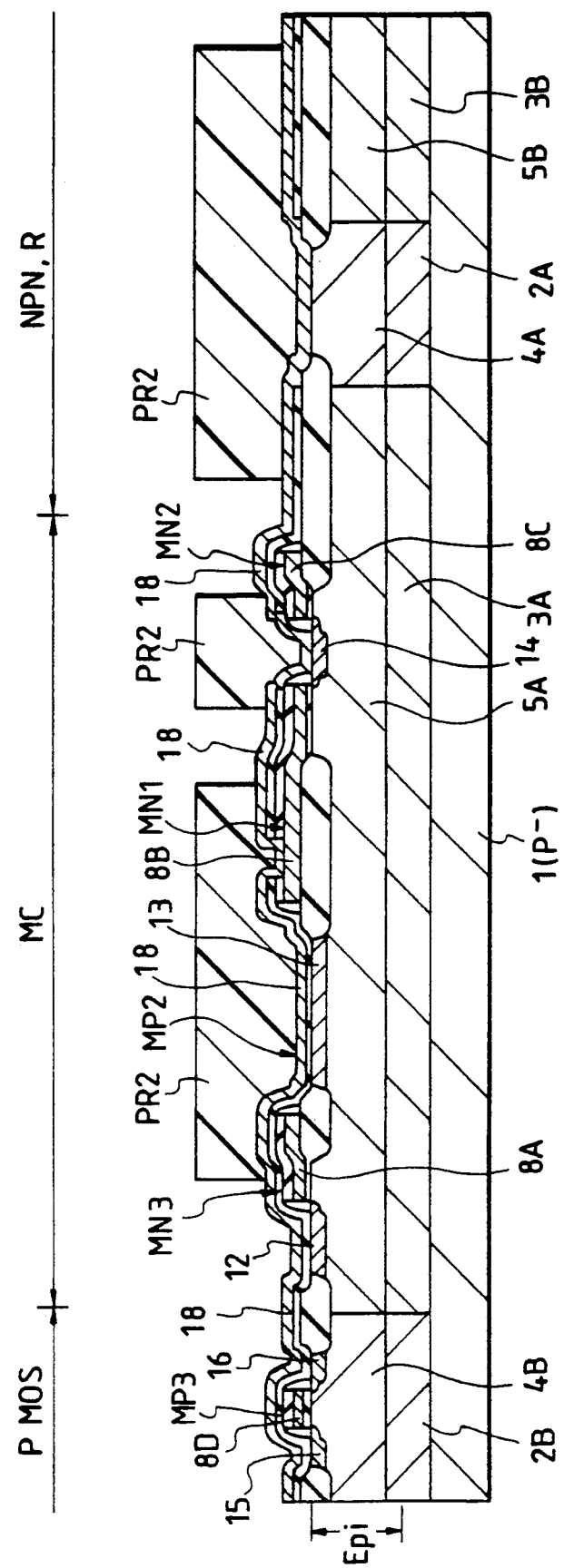

Referring next to FIG. 9, a photoresist mask PR2 is selectively formed on the polysilicon layer 18. The mask PR2 is a resist mask formed by the ordinary photolithography technology. The mask PR2 covers the source-drain region and channel region of the polysilicon PMOS MP2, pad electrode for feeding the power source potential VEM, base drawing layer of the bipolar transistor Q9 and the region of the resistor R1.

Figure 10:
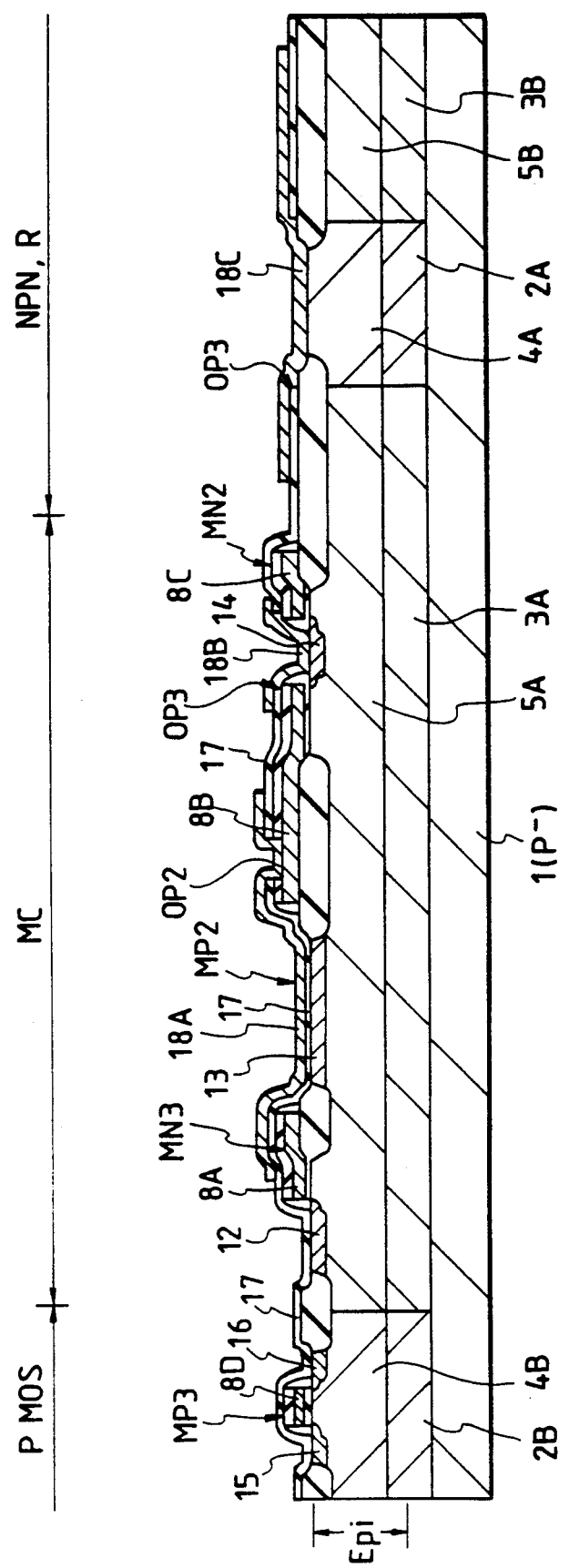
Figure 22:
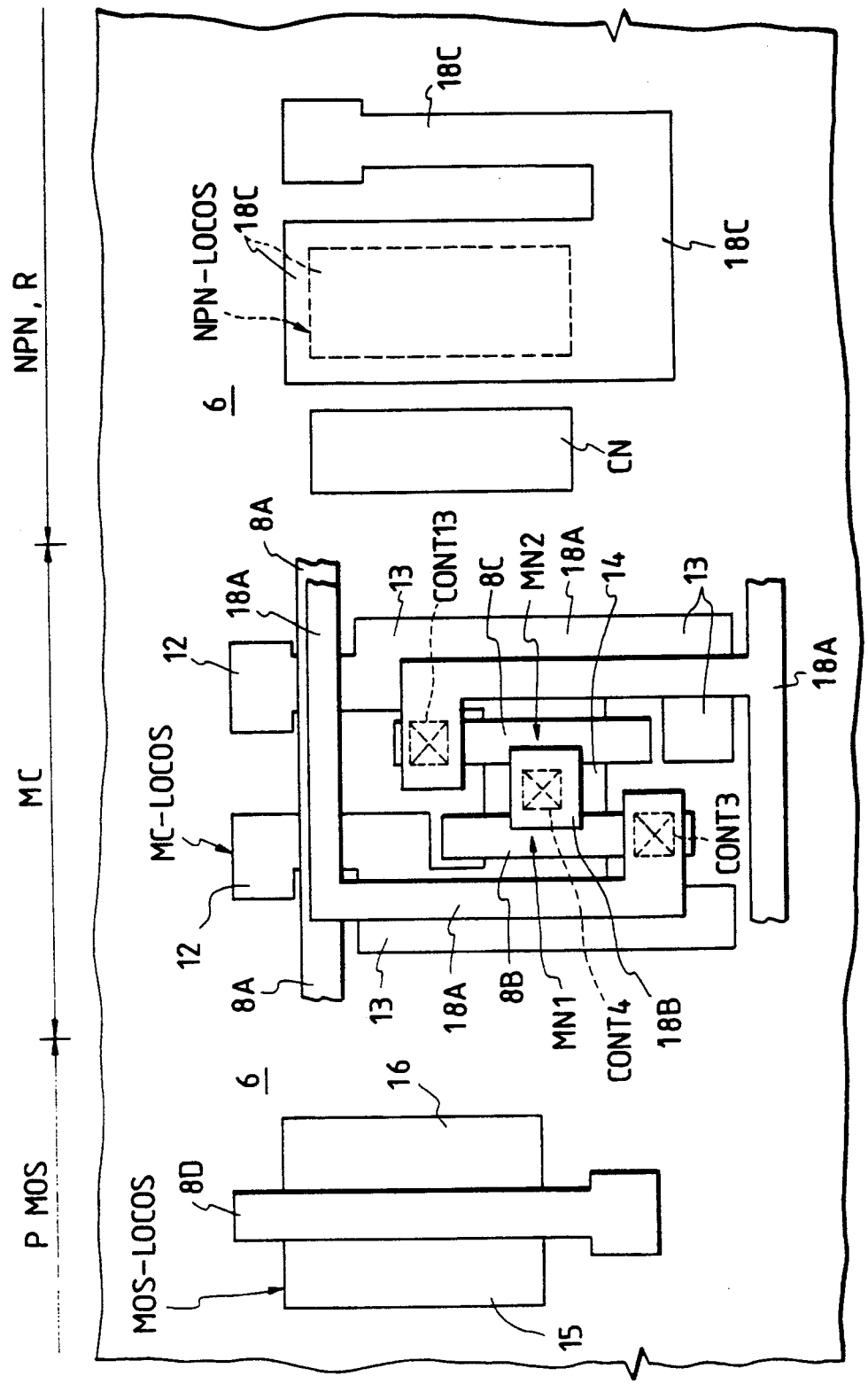
FIG. 22 is a plan view shoving the layout of the device that corresponds to FIG. 10.

Referring to FIG. 10, the polysilicon layer 18 is patterned by anisotropic etching such as RIE using the above mask PR2 as an etching mask, in order to simultaneously form a polysilicon layer 18A that serves as source-drain regions and channel region of the polysilicon PROS MP2, a polysilicon layer 18B that serves as the pad electrode, and a polysilicon layer 18C that serves as the base drawing layer and the resistor R1. An end (connection portion) of the polysilicon layer 18A is connected to the gate electrode 8B of the driver MOSFET MN1 via the opening OP1, and the polysilicon layer 18B is connected to the common source region 14 via the opening OP2. The polysilicon layer 18B is self-aligned to the gate electrodes 8B, 8C of driver MOSFETs MN1, MN2 and to the side wall spacers 11, and is connected to the common source region 14. FIG. 22 shows plan patterns of the polysilicon layers 18A, 18B and 18C which are the second polysilicon layers. In FIG. 22, the polysilicon layer 18A extends on the drain regions 13 of driver MOSFETs MN1, MN2 and is connected at its one end to the gate electrodes 8B, 8C via connection holes (openings OP1) CONT3, CONT13, and extends at its other end onto the gate electrode 8A. The polysilicon layer 18B is arranged between the gate electrodes 8B and 8C, and is connected to the common source region 14 via a connection hole (opening OP2) CONT4. Moreover, the polysilicon layer 18C enables the base drawing layer of the bipolar transistor Q9 and the resistor R1 to be formed in the same pattern. The mask PR2 is then removed.

Figure 11:
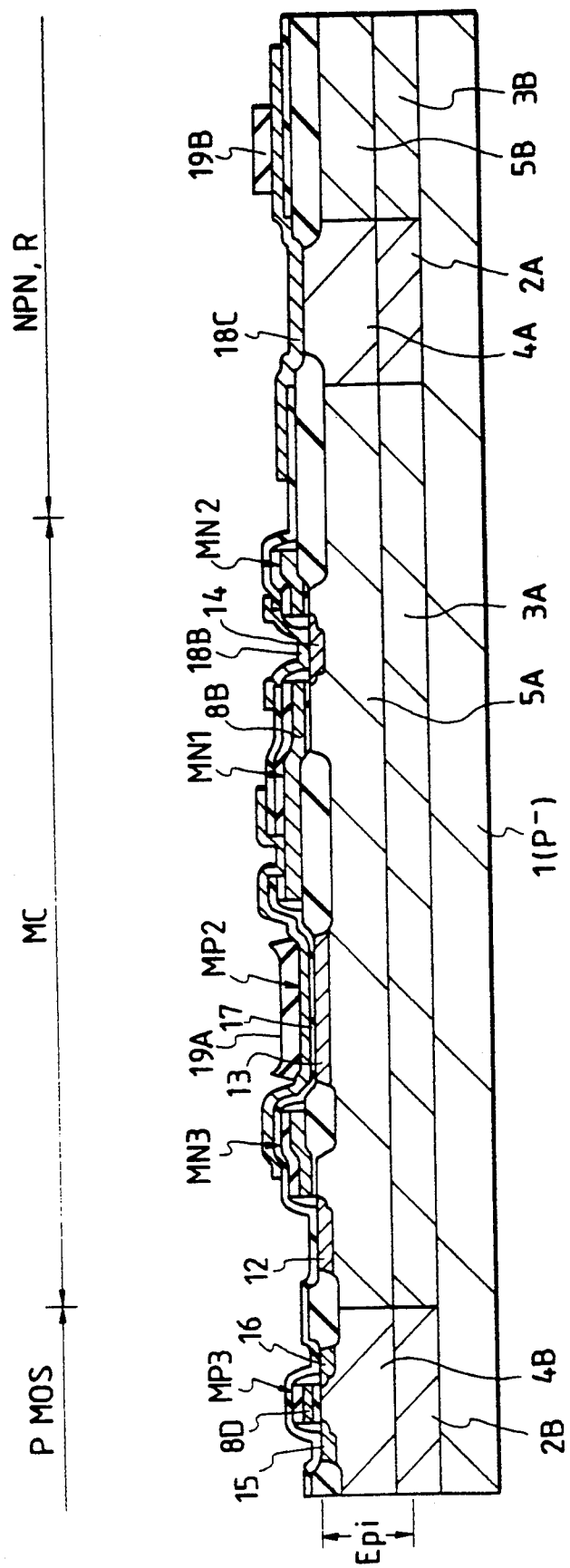
Figure 12:
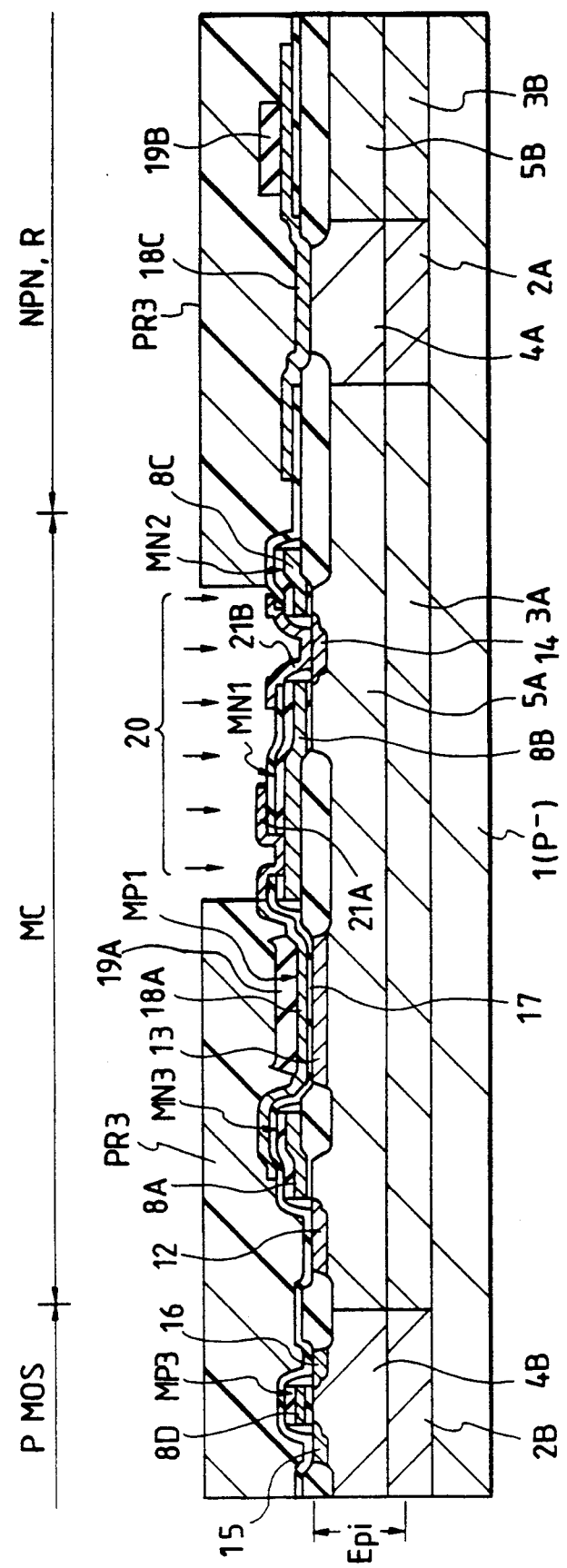

Referring next to FIG. 11, masks 19A and 19B are selectively formed on the polysilicon layer 18A and on the polysilicon layer 18C. The masks 19A, 19B are formed by patterning a silicon oxide film deposited by, for example, the CVD method relying upon the ordinary photolithography technology and etching technology. The mask 19A is so patterned as to cover the channel region of polysilicon PMOS and the mask 19B is so patterned as to cover the resistance R1. Next, as shown in FIG. 12, a photoresist mask PR3 is formed to cover portions of the polysilicon layer 18C and the polysilicon layer 18A. Then, using the mask PR3 as a mask for introducing impurities, n-type impurities (e.g., arsenic or phosphorus) 20 are selectively implanted at a high concentration into portions of the polysilicon layer 18B and the polysilicon layer 18A. Upon the introduction of the n-type impurities 20 the polysilicon layers 18A and 18B become electrically conductive, and there are formed a connection portion 21A and a pad electrode 21B of an n+-type polysilicon layer. The mask PR3 is then removed.

Figure 13:
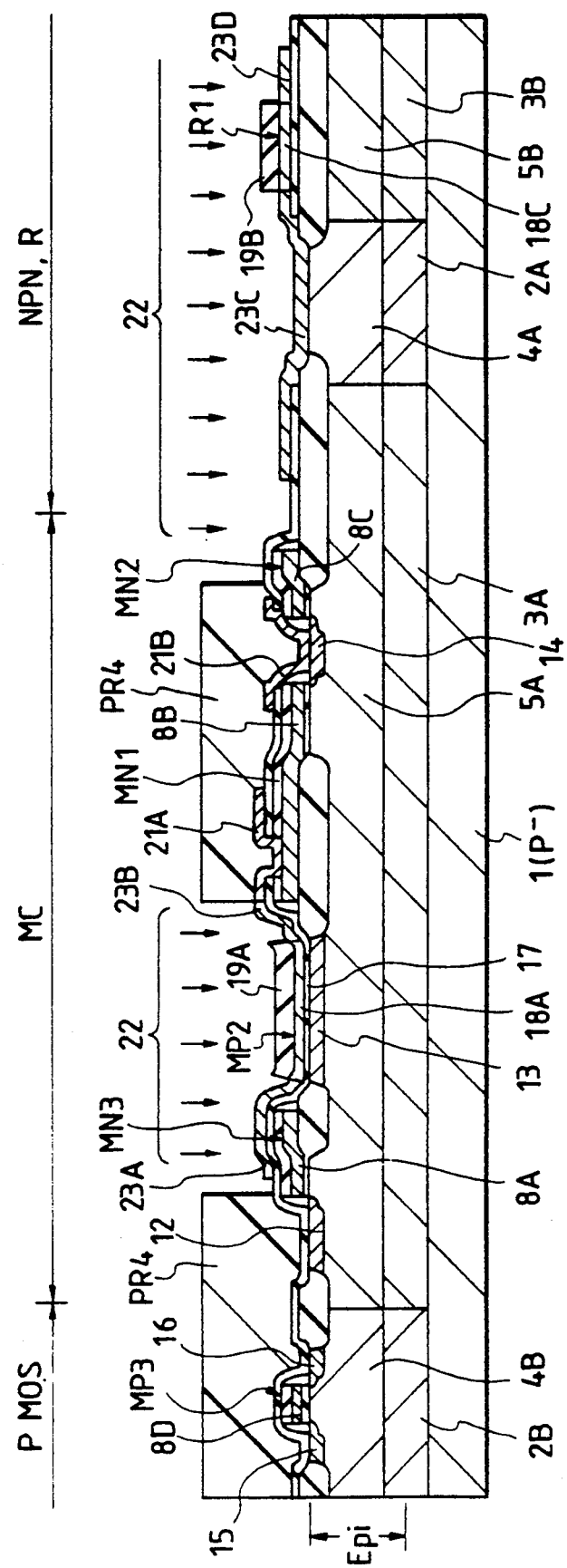

Next, as shown in FIG. 13, a photoresist mask PR4 is formed to cover the connection portion 21A, pad electrode 21B, p-channel MOSFET MP3 and semiconductor region 12. Thereafter, p-type impurities 22 are selectively introduced at a high concentration into a portion of the polysilicon layer 18A and a portion of the polysilicon layer 18C using the above mask PR4 and masks 19A, 19B as masks for introducing impurities. Upon the introduction of the p-type impurities 22, there are simultaneously formed source-drain regions 23A, 23B of polysilicon PMOS MP2, base drawing layer 23C and resistance connection portion 23D consisting of a p+-type polysilicon layer. The p-type impurities are not introduced into the polysilicon layers 18A, 18C under the masks 19A, 19B; i.e., the polysilicon layers 18A, 18C are used as a channel region 18A and a resistor R1. The mask PR4 is then removed.

Figure 14:
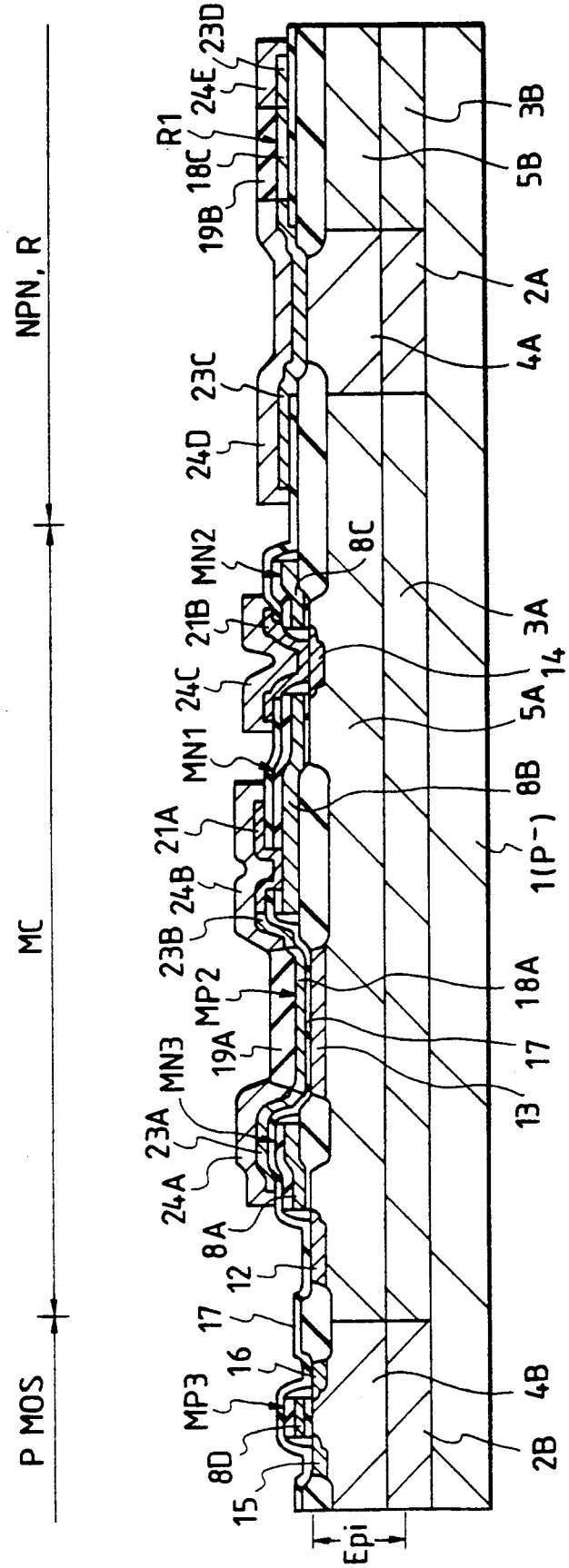
Figure 23:
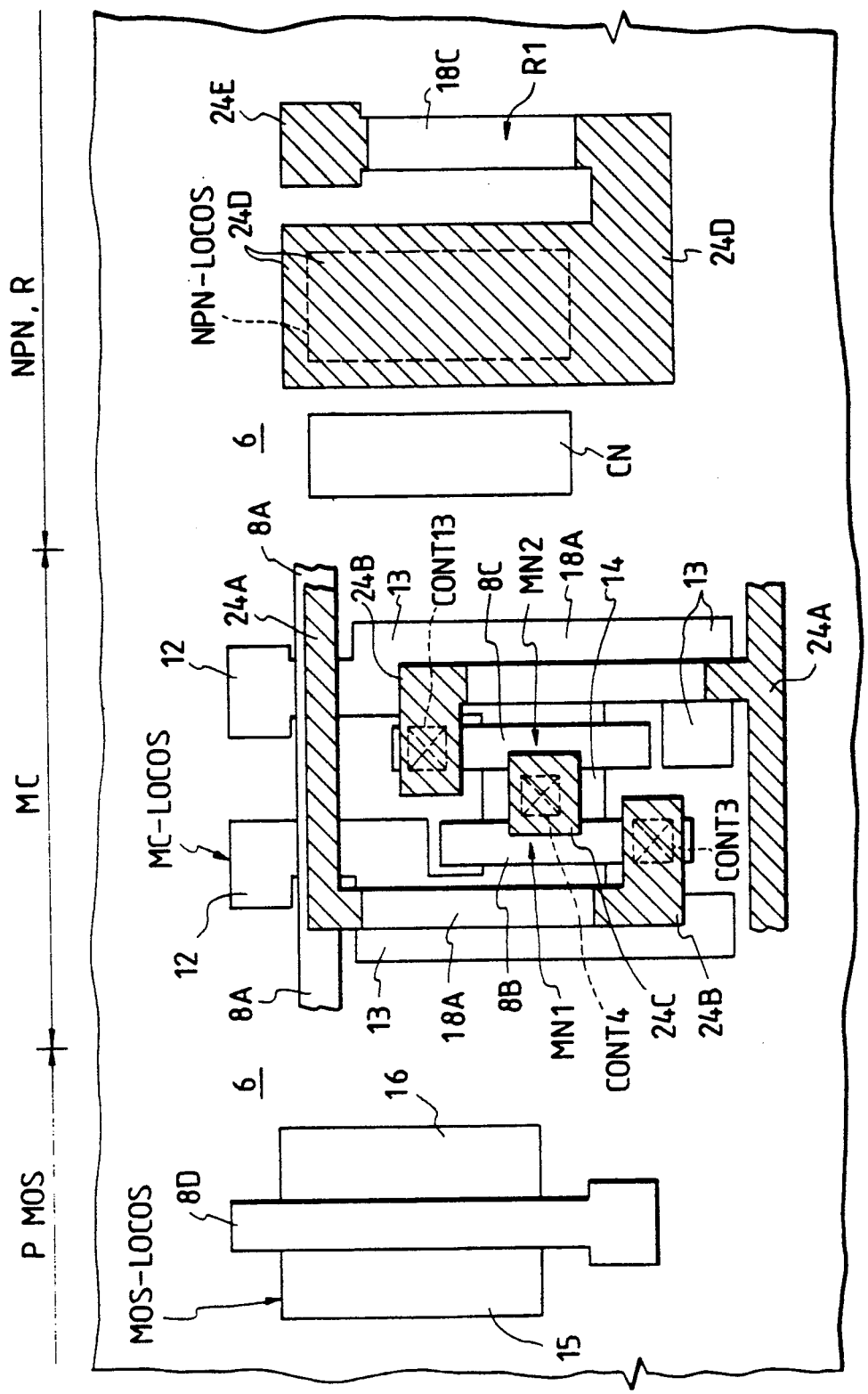
FIG. 23 is a plan view showing the layout of the device that corresponds to FIG. 14.

Next, as shown in FIG. 14, conductor layers 24A, 24B, 24C, 24D and 24E of tungsten (W) are simultaneously formed on the surfaces of the polysilicon layer constituting the source-drain regions 23A, 23B of polysilicon PMOS MP2, connection portion 21A, pad electrode 21B, base drawing layer 23C and resistance connection portion 23D. The conductor layers 24 are formed by the method of selectively growing tungsten maintaining a thickness of, for example, about 200 [nm]. The method of selectively growing tungsten is a CVD method which does not permit tungsten to grow on the insulating film ($SiO_2$ film) but which permits tungsten to grow on the polysilicon only. The conductor layers 24 permit the source-drain regions 23A, 23B of polysilicon PMOS MP2 and the base drawing layer 23C to have an increased thickness and to have a decreased resistance. Moreover the drain region 23B of polysilicon PMOS MP2 consisting of p+-type polysilicon layer and the connection portion 21A consisting of n+-type polysilicon are electrically connected to each other via the conductor layer 24B. FIG. 23 shows plan patterns of the conductor layers 24A, 24B, 24C, 24D and 24E, wherein hatched areas represent conductor layers 24A to 24E.

Figure 15:
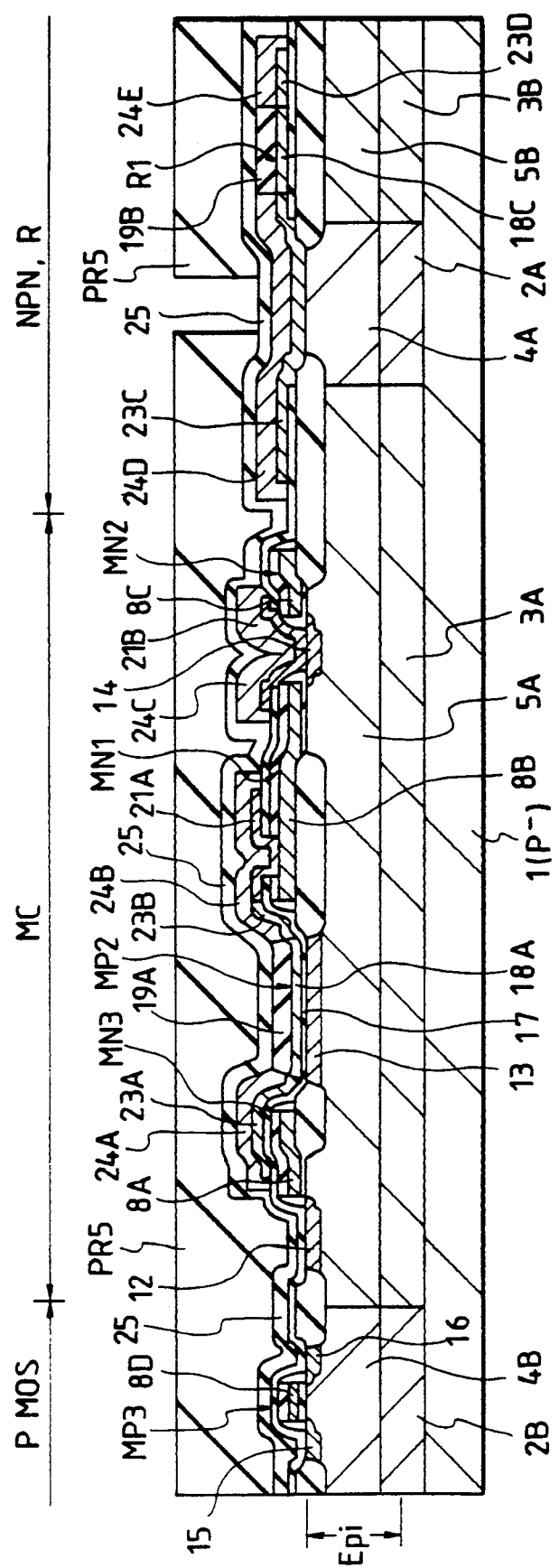

Referring next to FIG. 15, an interlayer insulating film 25 is formed on the whole surface of the substrate inclusive of the conductor layers 24. The interlayer insulating film 25 consists of a silicon oxide film deposited by the CVD method. Thereafter, a photoresist mask PR5 is formed to pattern the base drawing layer 23C of the bipolar transistor Q9. The mask PR5 has a mask pattern with openings where there will be formed the intrinsic base region and the emitter region of the bipolar transistor Q9. Then, the interlayer insulating film 25, conductor layer 24D and base drawing layer 23C are etched successively and selectively with the mask PR5 as an etching mask. The above etching is an anisotropic etching such as RIE. Due to this etching, the conductor layer 24D and the base drawing layer 23C are patterned to surround the emitter and base regions of the bipolar transistor Q9. The mask is then removed.

Figure 16:
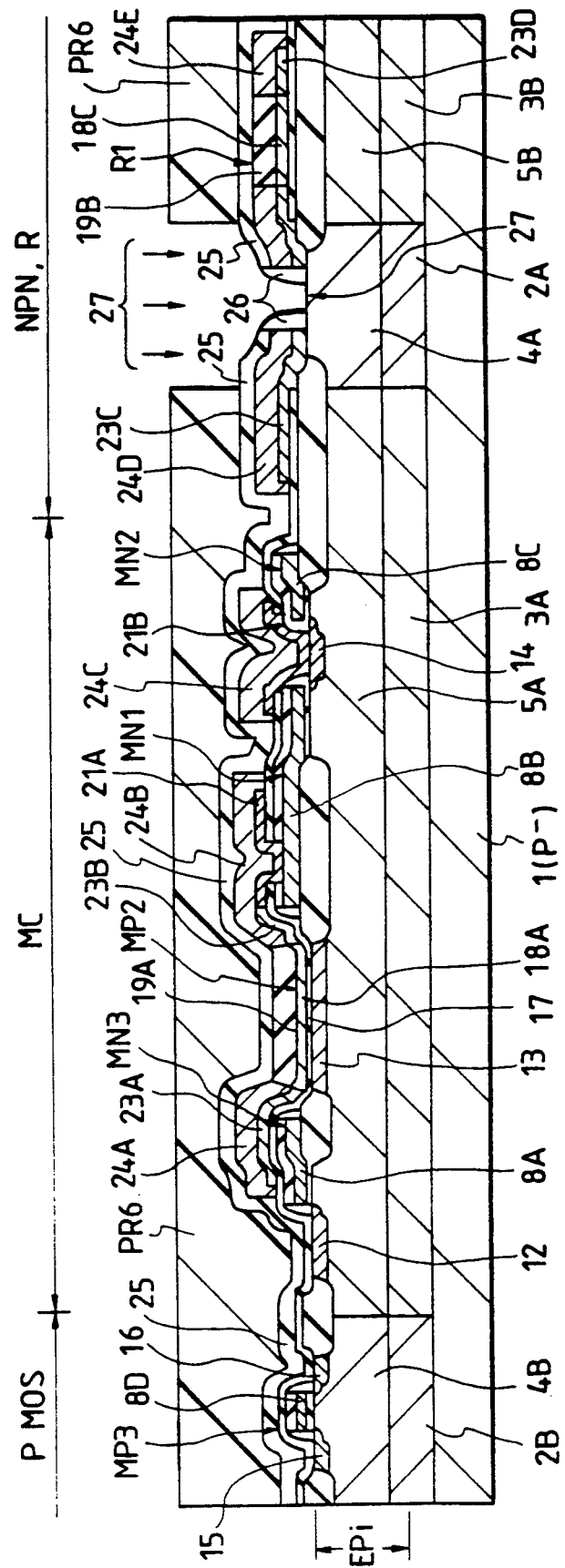

Referring next to FIG. 16, side wall spacers 26 consisting of an insulating film ($SiO_2$) are formed on the side portions of the patterned conductor layer 24D and the base drawing layer 23C. The spacers 26 can be formed in the same manner as the side wall spacers 11 of the LDD-structure MOSFETs MN1, MP3. Then, a photoresist mask PR6 is formed having an opening on the main surface of collector region 4A of the bipolar transistor Q9. Next, p-type impurities 27 for forming the intrinsic base region are introduced into the main surface of the collector region 4A using the mask PR6, conductor layer 24D, base drawing layer 23C, and side wall spacer 26 as masks for introducing impurities. The p-type impurities 27 comprise boron (B) of an impurity concentration of, for example, $10^{13}$ to $10^{14}$ [atoms/cm$^2$] and are implanted with relatively small energy.

Figure 17:
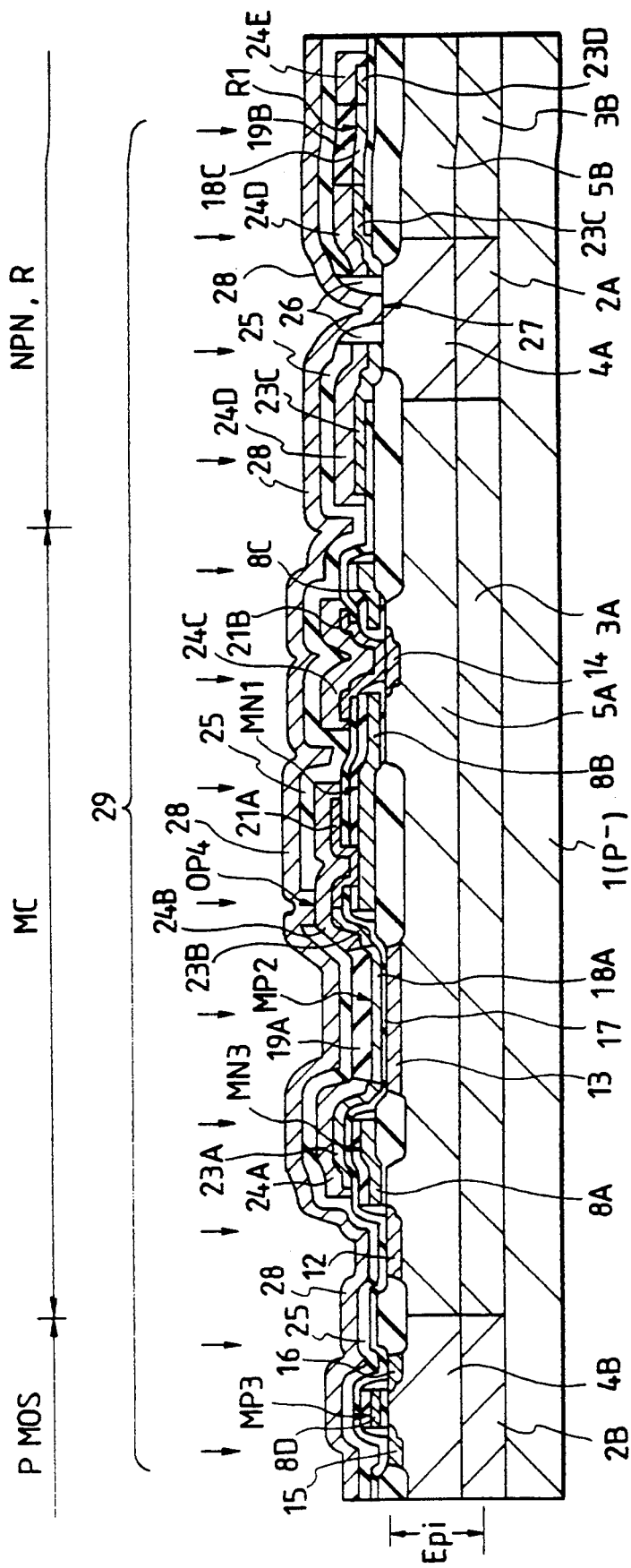

Referring next to FIG. 17, an opening OP4 is formed in the conductor layer 24B on the drain region 23B of polysilicon PMOS MP2. The opening OP4 is formed by the ordinary photolithography and etching technology by selectively removing the interlayer insulating film 25 by etching. Then, a polysilicon layer 28 is formed on the whole surface of the substrate inclusive of the opening portion defined by the side well spacers 26 and the upper portion of opening OP4. The polysilicon layer 28 is formed by, for example, the CVD method maintaining a thickness of about 150 [nm]. Then, n-type impurities 29 are introduced into the polysilicon layer 28. The n-type impurities 29 comprise arsenic (As) of an impurity concentration of as high as, for example, $10^{16}$ atoms/cm$^2$], and are implanted by the ion implantation method. Upon the introduction of the n-type impurities 29, the polysilicon layer 28 assumes the n+-type and is rendered conductive.

Figure 18:
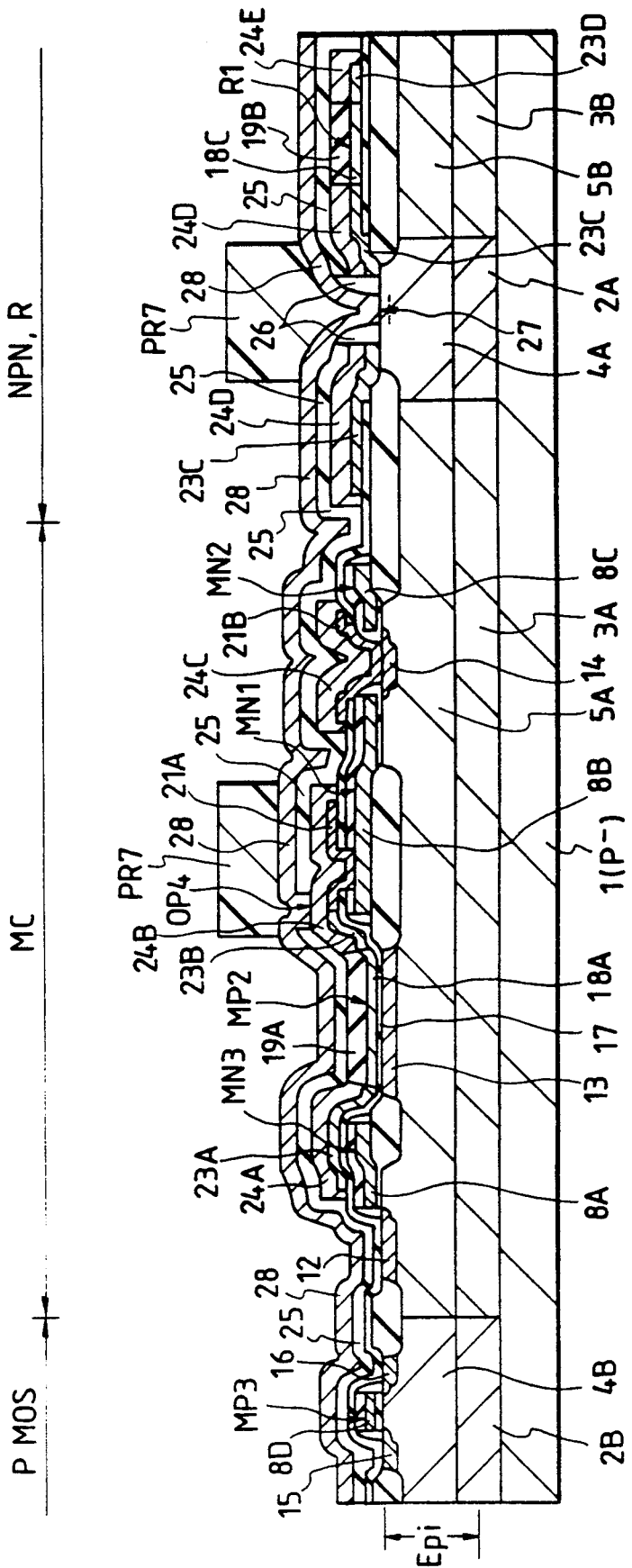
Figure 19:
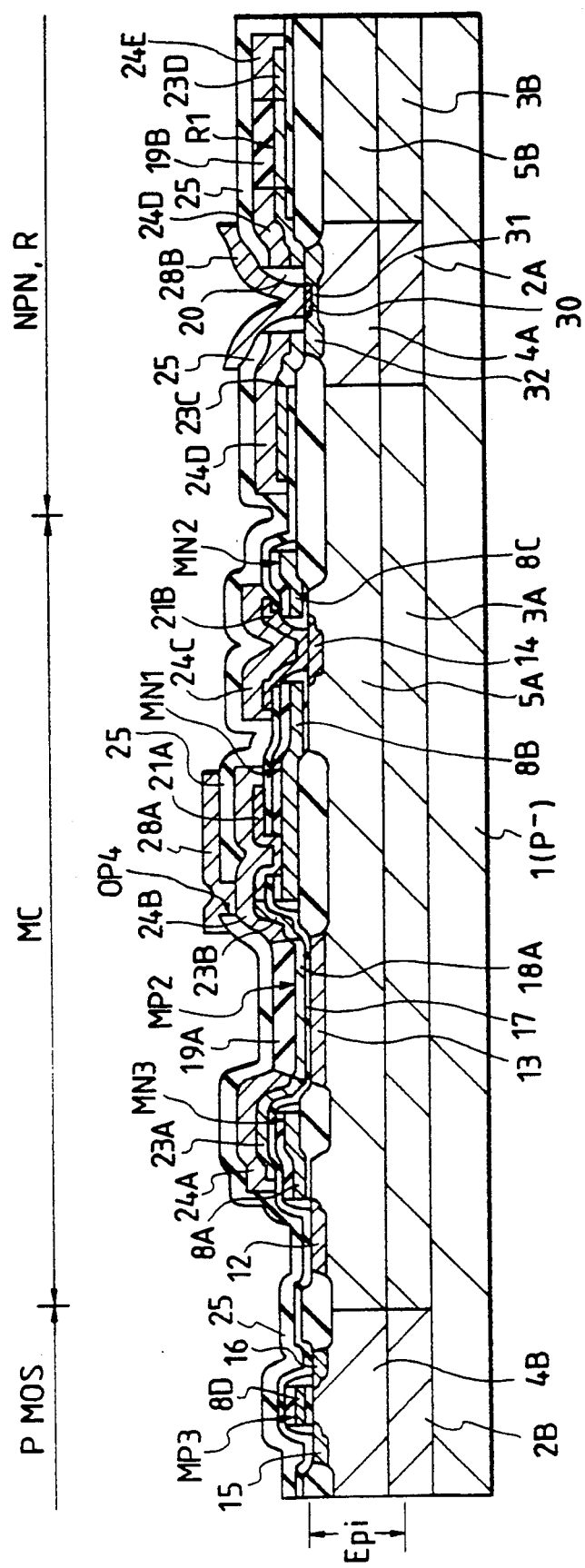
Figure 24:
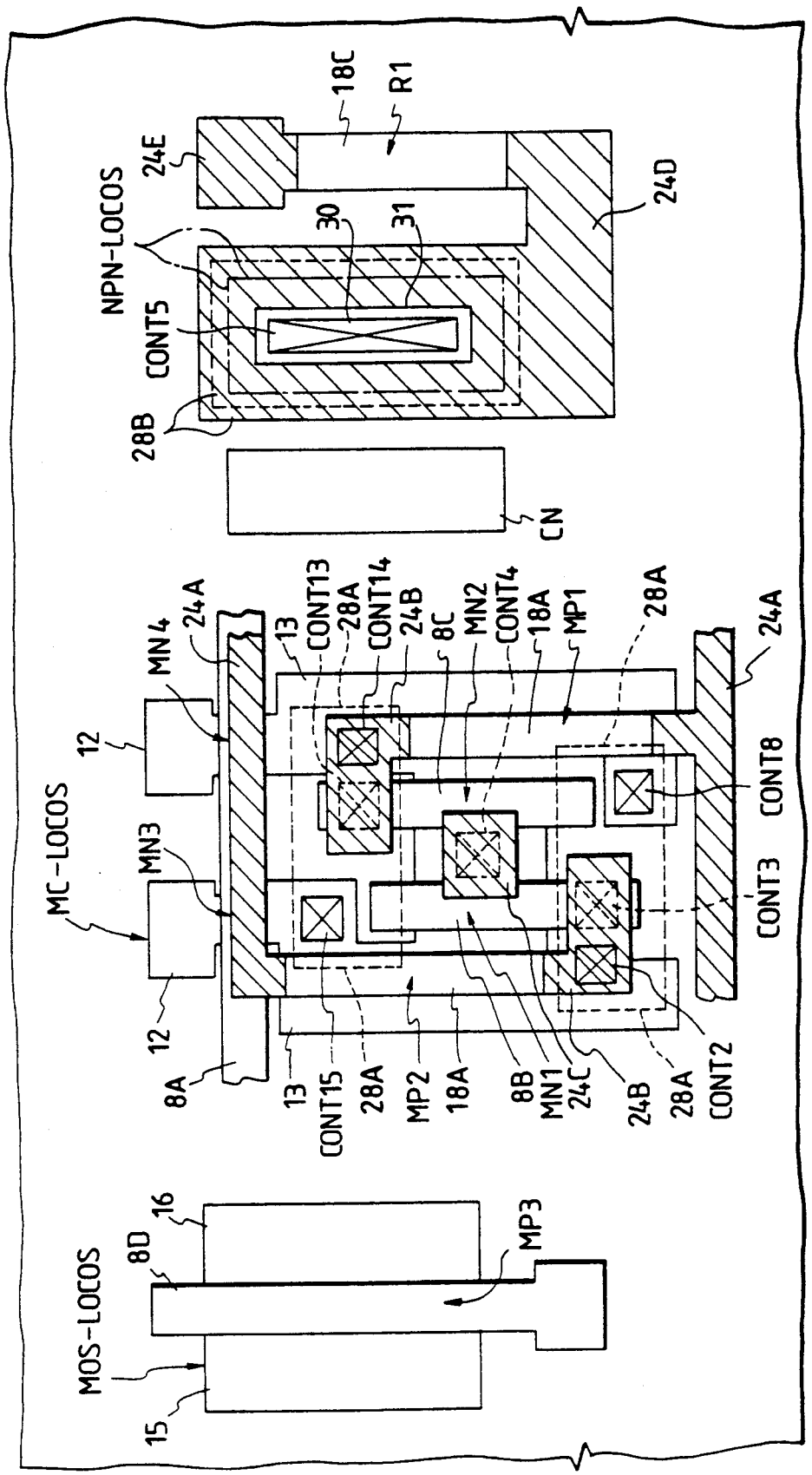
FIG. 24 is a plan view showing the layout of the device that corresponds to FIG. 19.

Referring next to FIG. 18, a photoresist mask PR7 is selectively formed on the polysilicon layer 28 of the regions MC, NPN and R. The mask PR7 has a pattern for forming cross-coupling wiring of the memory cell MC and emitter drawing layer of the bipolar transistor Q9. Next, the polysilicon layer 28 is selectively removed by etching using the above mask PR7 as an etching mask. The etching is the anisotropic etching such as RIE. Due to the etching, there are simultaneously formed a cross-coupling wiring 28A of the memory cell MC and the emitter drawing layer 28B of the bipolar transistor Q9. The substrate is then heat-treated, so that the n-type impurities introduced into the n+-type polysilicon layer 28B and the p-type impurities introduced into the p+-type polysilicon layer 23C are diffused being driven into the main surface of the collector region 4A. Due to this drive-in diffusion, there are formed an emitter region 30 of the bipolar transistor Q9 consisting of an n+-type semiconductor region and an external base region 32 consisting of a p+-type semiconductor region. Moreover, the p-type impurities 27 that have been introduced into the main surface of the collector region 4A are activated by the heat treatment and whereby an intrinsic base region 31 is formed consisting of a p-type semiconductor region. The external base region 32 and the intrinsic base region 31 are electrically connected together under the side wall spacer 11, and are formed as a unitary structure. Through the above-mentioned step of heat treatment, the bipolar transistor Q9 is substantially completed. FIG. 24 shows plan patterns of the cross-coupling wiring 28A, emitter drawing layer 28B, base drawing, layer 23C and conductor layer 24D. In FIG. 24, the cross-coupling wiring 28A is represented by a pattern of dotted line on the region MC, and is connected to the conductor layer 24B of tungsten that serves as a drain contact portion of the p-channel MOSFET MP2 via connection hole (opening OP4) CONT2. The cross-coupling wiring 28A is further connected to the drain region 13 of the driver MOSFET MN2 via a connection hole CONT8. The emitter drawing layer 28B is represented by a pattern of dotted line on the regions NPN and R, and is connected to the emitter region 30 via connection hole CONT5. The emitter drawing layer 28B extends superposed on the patterned base drawing layer 23C and the conductor layer 24D so as to surround the intrinsic base region 31, and is formed being self-aligned relative to the base drawing layer 23C, conductor layer 24D and side wall spacer 26, and is further connected to the emitter region 30 being self-aligned thereto. The bipolar transistor thus constituted in a self-aligned manner permits active regions such as emitter and base regions to be formed more finely than the resolution of photolithography technology. Therefore, parasitic capacitance is minimized, making it possible to increase the cut-off frequency $f_T$ and to increase the speed of operation of the SRAM constituted by Bi-CMOSs. When the ECL-driven SRAM is to be constituted as shown in FIG. 1, furthermore, it is considered that the number of bipolar transistors increases resulting in a drop in the degree of integration. According to the bipolar transistor of the present invention, however, the conductor layer 24D of a small resistance is formed on the base drawing layer 23C enabling the pattern of the base drawing layer to be minimized and further enabling the base drawing layer 23C and the conductor layer 24D to be used as wirings. It is therefore possible to highly densely form the SRAM constituted by Bi-CMOSs.

Referring next to FIG. 3, an interlayer insulating film 33 is formed on the whole surface of the substrate which includes such elements as the bipolar transistor Q9 and MOSFETs MN1, MN2, MN3, MN4, MP1 and MP2. The interlayer insulating film 33 has a two-layer structure formed by laminating, for example, a silicon oxide film and a BPSG (boron-phosphorus-silicate glass) film. The lower silicon oxide layer is deposited by the CVD method using a silane gas and a nitrogen oxide gas as source gases. The lower silicon oxide layer is formed maintaining a thickness of, for example, about 150 to 250 [nm] in order to prevent the leakage of impurities (P, B) from the upper BPSG layer. The upper BPSG layer is deposited by, for example, the CVD method. The upper BPSG layer is formed maintaining a thickness of, for example, about 300 to 500 [nm]. The BPSG layer is subjected to the condensation treatment and reflow treatment in a nitrogen gas atmosphere at a temperature of about 900° to 1000 [° C.]. Due to the reflow treatment, the surface of the upper BPSG layer constituting the interlayer insulating film 33 is flattened.

Next, the interlayer insulating films 33, 25 and the insulating film 17 are etched successively and selectively by the ordinary photolithography and etching technology in order to form a connection hole CONT9 that reaches the source-drain regions 15, 16 of the p-channel MOSFET MP3, connection holes CONT1 and CONT2 that reach the drain regions 12 of transmission MOSFETs MN3 and MN4, a connection hole CONT16 that reaches the conductor layer 24C for feeding power-source potential VEM, a connection hole CONT10 that reaches the collector pull-up region CN of the bipolar transistor, connection holes CONT17 and CONT6 that reach the emitter drawing layer 28B of the bipolar transistor and the conductor layer 24D on the base drawing layer 23C, and a connection hole CONT7 that reaches the connection portion (conductor layer 24E) of the resistance element R1. After the above connection holes are formed, there are formed wiring layers (electrodes) 34 to 40 that are connected to the source-drain regions 15, 16, and 12, conductor layers 24C, 24D, and 24E, and the emitter drawing layer 28B through said connection holes. The wiring layers 34 to 40 are formed by patterning the tungsten layer deposited, for example, by the CVD method by using the ordinary photolithography and etching technology.

Moreover, though not diagramed in FIG. 3, the above wiring layers are connected to the gate electrode 8D of the p-channel MOSFET through the connection hole CONT11 formed in the interlayer insulating film 33. Then, though not diagramed, an insulating film such as a silicon oxide film is formed on the whole surface of the substrate that includes the wiring layers 34 to 40, and a second wiring layer (e.g., aluminum alloy wiring) is formed thereon by the ordinary photolithography and etching technology in order to electrically connect the semiconductor elements together. Through the above-mentioned step, the SRAM constituted by Bi-CMOSs of the present invention is nearly completed.

According to the method of producing an SRAM constituted by Bi-CMOSs of the present invention as described above, the source-drain regions 23A, 23B and channel region 18A of polysilicon PMOSs MP1, MP2 in the CMOS-type memory cell and the base drawing layer 23C of the npn-type bipolar transistor Q9 in the peripheral circuit, are formed by the same polysilicon layer 18. Therefore, the number of steps for producing SRAMs is decreased and the process cost is decreased, too. In the polysilicon PMOSs MP1, MP2, furthermore, the source-drain regions 23A, 23B only are selectively thickened by the tungsten conductor layers 24A and 24B, offering a large margin for the over-etching at the time of forming connection holes CONT2 and CONT14 for connection to the wiring 28A. It is therefore allowed to improve electrical reliability of SRAMs and production yields. In the polysilicon PMOS of the present invention, furthermore, the gate electrode (semiconductor region) 13 is formed prior to forming the source-drain and channel regions and there is no likelihood that the channel region is deteriorated (e.g., crystal defects) by the over-etching at the time of forming polysilicon gate electrode compared with the case of ordinary MOSFETs having polysilicon gate electrode. Therefore, the MOSFET features an improved breakdown voltage.

In the foregoing was concretely described the invention accomplished by the present inventors by way of embodiments. It should, however, be noted that the present invention can be variously modified without departing from the gist and scope of the invention.

Figure 25:
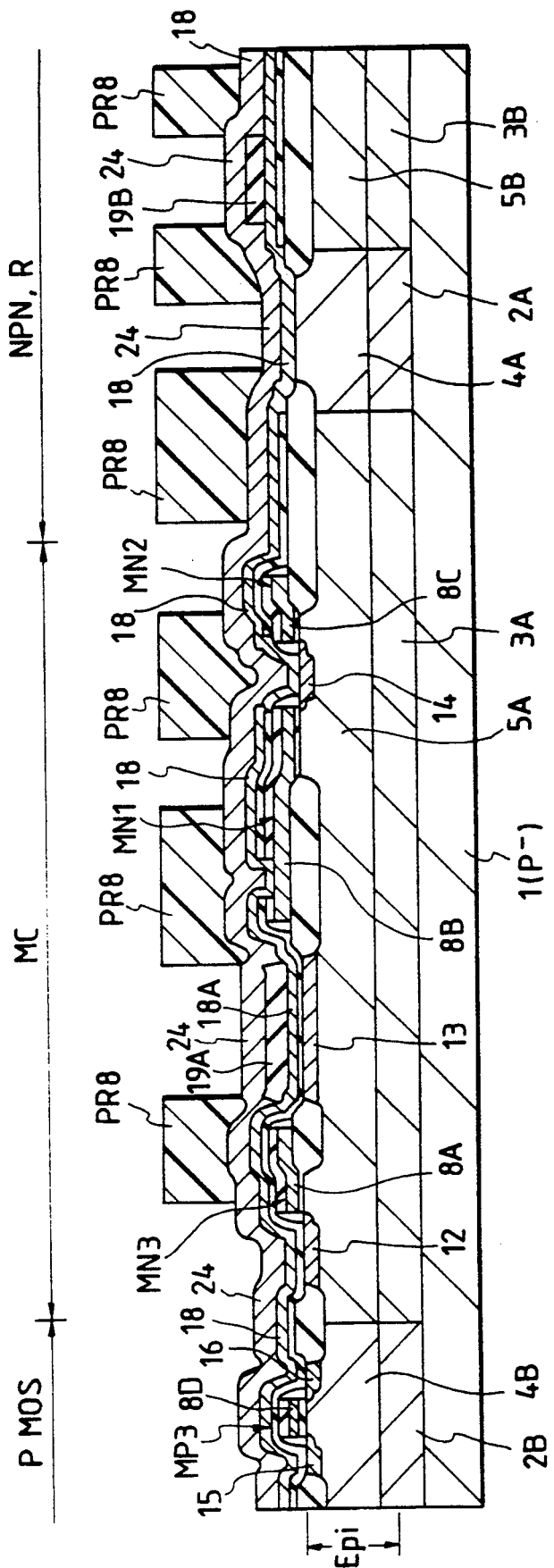
FIG. 25 is a sectional view illustrating major portions of a modified embodiment of the method of producing SRAMs constituted by Bi-CMOSs shown in FIGS. 2 and 3.

For instance, the conductor layers 24A, 24B, 24C, 24D and 24B of tungsten may be formed by the well-known whole-surface CVD method instead of the selective CVD method. In this case, after the step of FIG. 8, the masks 19A and 19B are formed as shown in FIG. 25 and, then, the tungsten layer 24 is formed on the whole surface of the polysilicon layer 18 by the widely known CVD method. Thereafter, the photoresist mask PRB is formed by the ordinary photolithography technology, the conductor layer 24 and the polysilicon layer 18 are selectively stack-cut by anisotropic etching such as RIE, in order to form patterns of the conductor layers 24A to 24E. In the case of stack-cut by etching, it is allowed to omit the step of patterning the base drawing layer shown in FIG. 15.

What is claimed is:

1. A semiconductor memory device comprising:
   a semiconductor substrate having a main surface;
   a plurality of memory cells of a static random access memory each of which includes first and second driver MISFETs, and first and second load MISFETs, wherein each of said first and second driver MISFETs has a gate insulating film formed on said main surface, a gate electrode formed on said gate insulating film, and source and drain regions formed in said semiconductor substrate;
   peripheral circuits including an npn-type bipolar transistor, wherein said npn-type bipolar transistor comprises an emitter region of n-type conductivity formed in said semiconductor substrate, and a base region of p-type conductivity formed in said semiconductor substrate so as to surround said emitter region;
   a first insulating film formed over said gate electrodes of said driver MISFETs and over said main surface so as to cover said main surface;
   a base lead-out layer of said npn-type bipolar transistor electrically connected to said base region and formed on said first insulating film;
   first semiconductor strips formed on said first insulating film, wherein source, drain and channel forming regions of said load MISFETs are formed in said first semiconductor strips,
   wherein said drain region of said first load MISFET is electrically connected to said drain region of said first driver MISFET and to said gate electrode of said second driver MISFET, wherein said drain region of said second load MISFETs is electrically connected to said drain region of said second driver MISFET and to said gate electrode of said first driver MISFET,
   wherein said first semiconductor strips and base lead-out layer are comprised by the same level layer of a polycrystalline silicon film, wherein said source and drain regions of said load MISFETs, and said base lead-out layer are p-type conductivity;
   first conductive layers selectively formed on said polycrystalline silicon film in such a manner that said first conductive layers are formed on said source and drain regions of said load MISFETs and on said base lead-out layer and in such a manner that said first conductive layers are not formed on said channel forming regions of said load MISFETs, wherein said first conductive layers have a resistance value smaller than that of said polycrystalline silicon film;
   a second insulating film formed over said first conductive layers so as to cover a portion of said main surface, said second insulating film having an opening; and
   a second conductive layer formed over said second insulating film and electrically connected to said first conductive layer through said opening in said second insulating film.

2. A semiconductor memory device according to claim 1, wherein said first conductive layers are comprised of high-melting temperature metal.

3. A semiconductor memory device according to claim 1, wherein said first conductive layers are comprised of high-melting temperature metal silicide.

4. A semiconductor memory device according to claim 2, wherein said high-melting temperature metal comprises tungsten.

5. A semiconductor memory device according to claim 4, wherein said high-melting temperature metal silicide comprises tungsten silicide.

6. A semiconductor memory device according to claim 1, wherein said polycrystalline silicon film has a film thickness thinner than that of said gate electrodes of said driver MISFETs.

7. A semiconductor memory device according to claim 6, wherein said polycrystalline silicon film which comprises said channel forming region of said first load MISFET is formed over said drain region of said second driver MISFET, and wherein said polycrystalline silicon film which comprises said channel forming region of said second load MISFET is formed over said drain region of said first driver MISFET.

8. A semiconductor memory device according to claim 7, wherein said first insulating film formed between said drain region of said driver MISFETs and said polycrystalline silicon film serves as gate insulating films of said load MISFETs.

9. A semiconductor memory device according to claim 6, wherein said peripheral circuits further include a p-channel MISFET having a gate electrode, wherein said gate electrode of said p-channel MISFET and said gate electrodes of said driver MISFETs are the same level layer and have n-type conductivity, and wherein said second insulating film is formed over said gate electrode of said p-channel MISFET.

10. A semiconductor memory device according to claim 6, wherein said first conductive layers are formed, by a selective CVD method, on said polycrystalline silicon film.

11. A semiconductor memory device according to claim 10, further comprising:

an emitter lead-out layer electrically connected to said emitter region and formed over said second insulating film, wherein said emitter lead-out layer is comprised of a polycrystalline silicon film of n-type conductivity.

12. A semiconductor memory device according to claim 6, wherein a first potential is applied to said source regions of said load MISFETs, and a second potential which is lower than that of said first potential is applied to said source regions of said driver MISFETs.

13. A semiconductor memory device according to claim 1, wherein said second conductive layer is an Al-wiring layer, and wherein said Al-wiring layer is electrically connected to said first conductive layer on said base lead-out layer via said opening in said second insulating film.

* * * * *